United States Patent
Kwon et al.

(10) Patent No.: US 9,978,932 B2
(45) Date of Patent: May 22, 2018

(54) SEMICONDUCTOR DEVICES AND METHODS OF FABRICATING THE SAME

(71) Applicant: Samsung Electronics Co., Ltd., Suwon-si, Gyeonggi-do (KR)

(72) Inventors: Hyungjoon Kwon, Seongnam-si (KR); Sechung Oh, Suwon-si (KR); Vladimir Urazaev, Suwon-si (KR); Ken Tokashiki, Seongnam-si (KR); Jongchul Park, Seongnam-si (KR); Gwang-Hyun Baek, Seoul (KR); Jaehun Seo, Suwon-si (KR); Sangmin Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days. days.

(21) Appl. No.: 15/057,101

(22) Filed: Feb. 29, 2016

(65) Prior Publication Data

US 2016/0181511 A1 Jun. 23, 2016

Related U.S. Application Data

(63) Continuation of application No. 14/070,471, filed on Nov. 1, 2013, now Pat. No. 9,496,488.

(30) Foreign Application Priority Data

Nov. 2, 2012 (KR) .................. 10-2012-0123598

(51) Int. Cl.
*H01L 43/02* (2006.01)
*H01L 43/08* (2006.01)
(Continued)

(52) U.S. Cl.
CPC ............ *H01L 43/08* (2013.01); *G11C 11/161* (2013.01); *H01L 27/222* (2013.01);
(Continued)

(58) Field of Classification Search
CPC ......... H01L 43/02; H01L 27/22; H01L 43/08; H01L 45/04; H01L 45/02; H01L 43/1233; H01L 45/148; H01L 45/146
(Continued)

(56) References Cited

U.S. PATENT DOCUMENTS 6,630,387 B2 10/2003 Horii
6,764,896 B2 7/2004 Okudaira
(Continued)

FOREIGN PATENT DOCUMENTS

CN 102709241 A 10/2012
JP 2002100747 A 4/2002
(Continued)

*Primary Examiner* — Asok K Sarkar
*Assistant Examiner* — Dmitriy Yemelyanov
(74) *Attorney, Agent, or Firm* — Renaissance IP Law Group LLP

(57) ABSTRACT

Provided are semiconductor devices and methods of fabricating the same. The semiconductor device may include lower wires, upper wires crossing the lower wires, select elements provided at intersections between the lower and upper wires, and memory elements provided between the select elements and the upper wires. Each of the memory elements may include a lower electrode having a top width greater than a bottom width, and a data storage layer including a plurality of magnetic layers stacked on a top surface of the lower electrode and having a rounded edge.

17 Claims, 23 Drawing Sheets

(51) Int. Cl.
*H01L 27/22* (2006.01)
*G11C 11/16* (2006.01)
*H01L 45/00* (2006.01)
*H01L 27/24* (2006.01)
*H01L 43/10* (2006.01)

(52) U.S. Cl.
CPC ............ *H01L 27/228* (2013.01); *H01L 43/02* (2013.01); *H01L 27/2436* (2013.01); *H01L 27/2463* (2013.01); *H01L 43/10* (2013.01); *H01L 45/04* (2013.01); *H01L 45/06* (2013.01); *H01L 45/1233* (2013.01); *H01L 45/144* (2013.01); *H01L 45/146* (2013.01); *H01L 45/147* (2013.01); *H01L 45/148* (2013.01)

(58) Field of Classification Search
USPC ......................................................... 257/421
See application file for complete search history.

(56) References Cited

U.S. PATENT DOCUMENTS

| | | |
|---|---|---|
| 7,670,933 B1 | 3/2010 | Wang et al. |
| 2001/0055851 A1 | 12/2001 | Horii |
| 2003/0143805 A1 | 7/2003 | Okudaira |
| 2005/0105325 A1* | 5/2005 | Haneda ................... G11C 11/15 365/154 |
| 2005/0195532 A1* | 9/2005 | Sugiyama ............. G11C 11/161 360/322 |
| 2005/0270828 A1 | 12/2005 | Motoyoshi |
| 2006/0172439 A1 | 8/2006 | Leuschner |
| 2009/0065940 A1 | 3/2009 | Kim et al. |
| 2009/0250776 A1 | 10/2009 | Takenaga et al. |
| 2011/0001114 A1 | 1/2011 | Landerighi et al. |
| 2014/0061645 A1 | 3/2014 | Li et al. |

FOREIGN PATENT DOCUMENTS

| | | |
|---|---|---|
| KR | 100475024 B1 | 2/2005 |
| KR | 100498439 B1 | 7/2005 |
| KR | 20060097865 A | 9/2006 |

* cited by examiner

SEMICONDUCTOR DEVICES AND METHODS OF FABRICATING THE SAME

CROSS-REFERENCE TO RELATED APPLICATIONS

This U.S. non-provisional patent application is a continuation of U.S. patent application Ser. No. 14/070,471, filed Nov. 1, 2013, which application claims priority under 35 U.S.C. § 119 to Korean Patent Application No. 10-2012-0123598, filed on Nov. 2, 2012, in the Korean Intellectual Property Office, the entire contents of which are hereby incorporated by reference.

BACKGROUND

Example embodiments of the inventive concept relate to semiconductor devices and methods of fabricating the same, and in particular, to semiconductor devices including conductive patterns formed not by a patterning process and methods of fabricating the same.

Semiconductor devices are important elements in the electronics industry because of their small size, multi-functionality, and/or low-cost characteristics. Semiconductor devices include, for example, a memory device for storing data, a logic device for processing data, and a system-on-chip configured to perform functions of memory storage and data processing.

As the electronics industry advances, the integration density of semiconductor devices rapidly increases. However, this results in various technical difficulties, such as a decrease in the process margin or increasing difficulties in unit processes.

SUMMARY

Example embodiments of the inventive concept provide semiconductor devices including conductive patterns that are separated from each other, but that are formed not by a patterning process.

Other example embodiments of the inventive concept provide methods of separating patterns from each other without a patterning process.

According to example embodiments of the inventive concepts, a semiconductor device may include lower wires, upper wires crossing the lower wires, a plurality of select elements provided at intersections between the lower and upper wires, and memory elements provided between the select elements and the upper wires. Each of the memory elements may include a lower electrode having a top width greater than a bottom width thereof, and a data storage layer having a rounded edge and including a plurality of magnetic layers stacked on a top surface of the lower electrode.

In example embodiments, a thickness of the data storage layer, which may be measured from the top surface of the lower electrode, may be smaller than a minimum space between the lower electrodes disposed adjacent to each other.

In example embodiments, the device may further include an insulating gap-fill layer, filling spaces between the memory elements disposed adjacent to each other and expose top surfaces of the data storage layers. The insulating gap-fill layer may be sidewalls of the data storage layers.

In example embodiments, each of the memory elements may further include an insulating spacer surrounding the sidewall of the lower electrode.

In example embodiments, the data storage layer may include a body portion covering the top surface of the lower electrode, and an edge portion extending from the body portion and covering partially a sidewall of the insulating spacer.

In example embodiments, a thickness of the edge portion of the data storage layer decreases from the top surface of the lower electrode toward a bottom surface thereof.

In example embodiments, the device may further include an insulating mold pattern surrounding lower portions of the lower electrodes. A height difference between top surfaces of the lower electrode and the insulating mold pattern may be greater than a top width of the lower electrode.

In example embodiments, a ratio of the top width of the lower electrode to the height difference between the top surfaces of the lower electrode and the insulating mold pattern ranges from about 1:2 to about 1:5.

In example embodiments, the top surface of the insulating mold pattern and a sidewall of the lower electrode form an angle of about 45 to about 90 degrees.

In example embodiments, the device may further include a remaining data storage layer provided on the top surface of the insulating mold pattern. The remaining data storage layer may be formed of the same material as the data storage layer and may be separated from the data storage layer.

In example embodiments, a lowest point of the data storage layer may be located at a level lower than an uppermost surface of the lower electrode.

In example embodiments, the data storage layer may include a first magnetic layer and a second magnetic layer provided on the lower electrode, and a tunnel barrier layer interposed between the first and second magnetic layers.

In example embodiments, the first magnetic layer may include a body portion covering the top surface of the lower electrode, and an edge portion extending from the body portion and partially covering a sidewall of an insulating spacer provided on a sidewall of the lower electrode. The tunnel barrier layer and the second magnetic layer may be provided on the body portion of the first magnetic layer, and the second magnetic layer may be separated from the first magnetic layer.

In example embodiments, the data storage layer may further include a capping electrode layer provided on the second magnetic layer and separated from the first magnetic layer.

According to example embodiments of the inventive concepts, a semiconductor device may include lower electrodes protruding from a top surface of an insulating mold pattern and having a top width greater than a bottom width thereof, data storage layers connected to the lower electrodes, respectively, each of the data storage layers having a rounded edge and including a first magnetic layer, a second magnetic layer, and a tunnel barrier layer interposed between the first and second magnetic layers, an insulating gap-fill layer filling spaces between the data storage layers disposed adjacent to each other and between the lower electrodes disposed adjacent to each other, the insulating gap-fill layer being in direct contact with sidewalls of the first magnetic layer, the second magnetic layer, and the tunnel barrier layer, and upper electrodes connected to the data storage layers, respectively.

According to example embodiments of the inventive concepts, a method of fabricating a semiconductor device may include forming lower electrodes protruding from a top surface of an insulating mold pattern, each of the lower electrodes having a top width greater than a bottom width thereof, depositing a plurality of magnetic layers to form data storage layers localized on the lower electrodes, without using a patterning process, each of the data storage layers having a rounded edge, and forming an insulating gap-fill layer to fill spaces between the data storage layers and between the lower electrodes and expose top surfaces of the data storage layers.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
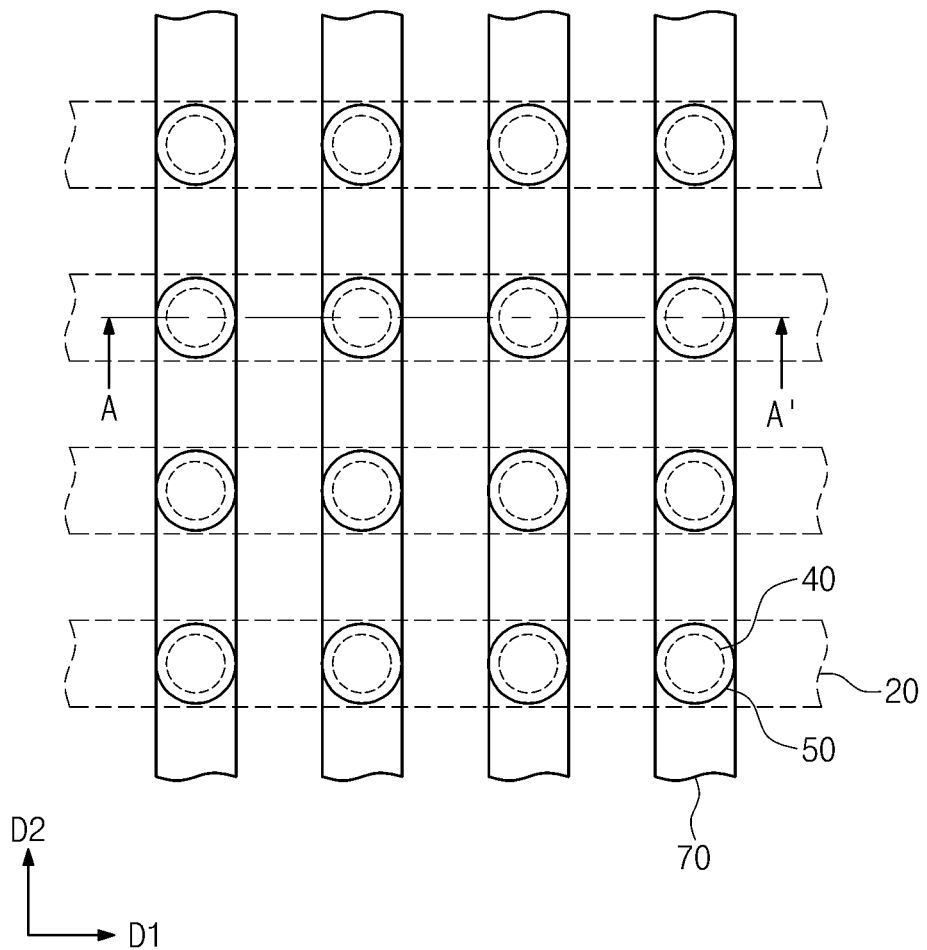
FIGS. 1A and 1B are plan views illustrating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Firstly, semiconductor devices and methods of fabricating the same, according to example embodiments of the inventive concept, will be described with reference to FIGS. 1A and 1B and FIGS. 2A through 2F.

Figure 1B:
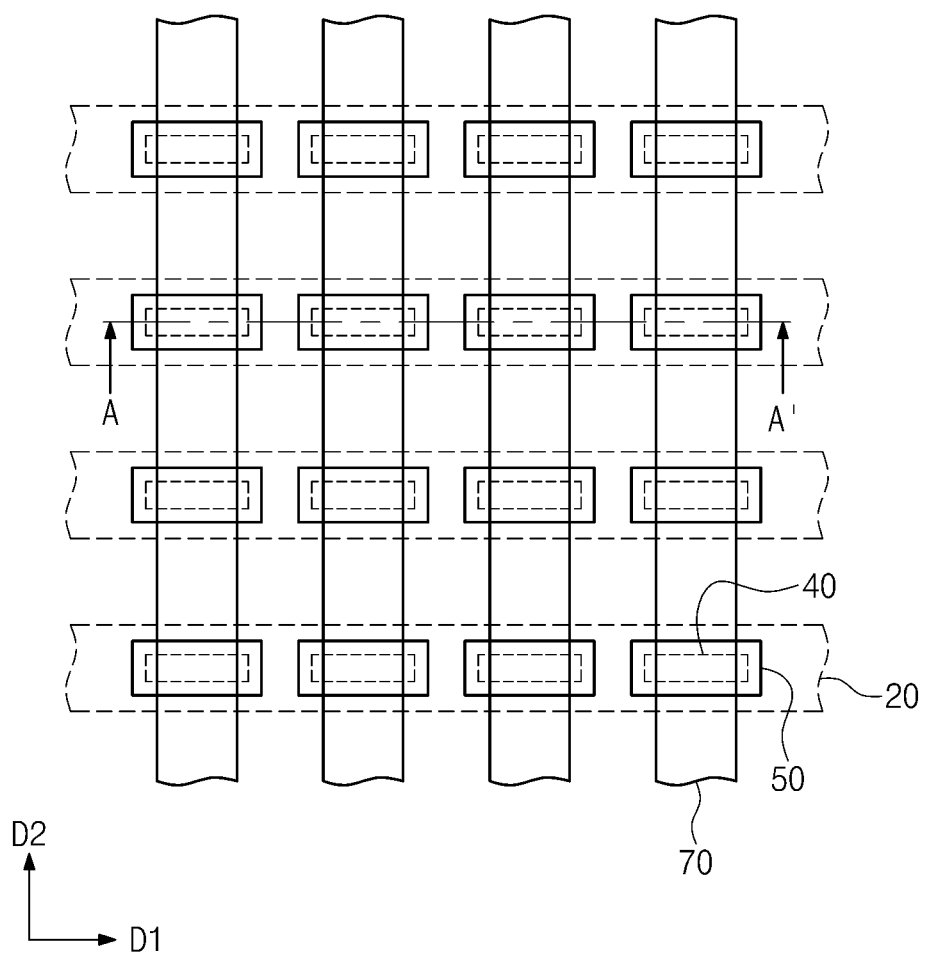

FIGS. 1A and 1B are plan views illustrating a semiconductor device according to example embodiments of the inventive concept. FIGS. 2A through 2F are cross-sectional views taken along line A-A' of FIG. 1A or 1B to illustrate a method of fabricating a semiconductor device according to example embodiments of the inventive concept.

Referring to FIGS. 1A and 1B, first wires 20 may be provided on a semiconductor substrate 10 to extend along a first direction, and second wires 70 may be provided on the first wires 20 to extend along a second direction or cross the first wires 20. Lower electrodes 40 and conductive layers 50 may be provided at intersections of the first wires 20 and the second wires 70, respectively. Each stack containing a lower electrode 40 and conductive layer 50 may be spaced apart from other stacks containing lower electrodes 40 and conductive layers 50 in plan view. In an example embodiment, the lower electrodes 40 may be spaced apart from each other by a uniform space. In other embodiments, the lower electrodes 40 may be disposed to form a zigzag arrangement, in plan view.

Figure 2A:
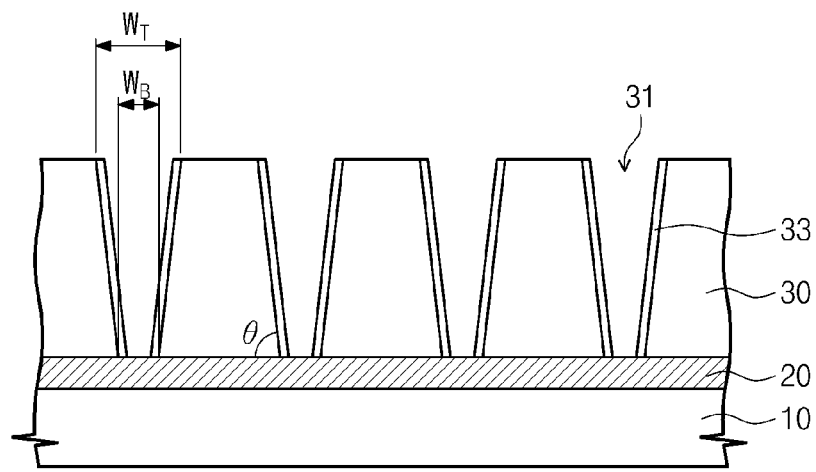
FIGS. 2A through 2F are cross-sectional views that are taken along line A-A' of FIG. 1A or 1B to illustrate a method of fabricating a semiconductor device according to example embodiments of the inventive concept.

Referring to FIGS. 1A, 1B, and 2A, lower conductive elements may be formed on the semiconductor substrate 10. In example embodiments, the lower conductive elements may be the first wires 20 extending along the first direction. In other embodiments, instead of the first wires 20, other conductive structures may be provided on the semiconductor substrate 10.

The semiconductor substrate 10 may be formed of a single crystalline semiconductor material (e.g., a silicon wafer). Alternatively, the semiconductor substrate 10 may be one of a silicon-on-insulator (SOI) wafer, a germanium wafer, a germanium-on-insulator (GOI) wafer, a silicon-germanium wafer, or a wafer including an epitaxial layer (e.g., formed by a selective epitaxial growth (SEG) process).

An insulating mold layer 30 may be formed on the semiconductor substrate 10 to have openings 31, each of which exposes a portion of the corresponding of the first wires 20.

In example embodiment, the insulating mold layer 30 may be formed to have a single-layered structure. Alternatively, the insulating mold layer 30 may be formed to have a multi-layered structure. For example, the insulating mold layer 30 may include multiple insulating layers alternatingly stacked one on another and having an etch selectivity with respect to each other. For example, to control a height of protruding portions of the lower electrodes 40 to be formed in a subsequent process, the insulating mold layer 30 may include an etch stop layer (e.g., 37 of FIG. 2F) inserted therein. In other embodiments, the insulating mold layer 30 may be formed of a doped insulating layer (e.g., phosphosilicate glass (PSG), borosilicate glass (BSG), borophosphosilicate glass (BPSG)), and lower and upper portions of the insulating mold layer 30 may have different doping concentrations from each other.

In example embodiment, the insulating mold layer 30 may be formed to have a thickness of about 500 Å to 2000 Å. The insulating mold layer 30 may be formed using a deposition process with a good step coverage property. For example, the insulating mold layer 30 may be formed of a chemical vapor deposition process.

The insulating mold layer 30 may be formed of, for example, high density plasma (HDP) oxide, TEOS (TetraEthylOrthoSilicate), PE-TEOS (Plasma Enhanced TetraEthylOrthoSilicate), $O_3$-TEOS ($O_3$-Tetra Ethyl Ortho Silicate), USG (Undoped Silicate Glass), PSG (PhosphoSilicate Glass), BSG (Borosilicate Glass), BPSG (BoroPhosphoSilicate Glass), FSG (Fluoride Silicate Glass), SOG (Spin On Glass), TOSZ (Tonen SilaZene) or any combination thereof. Alternatively, the insulating mold layer 30 may be formed of silicon nitride, silicon oxynitride, or low-k dielectrics.

The formation of the openings 31 may include forming a mask patterns (not shown) on the insulating mold layer 30, and anisotropically etching the insulating mold layer 30 using the mask patterns as an etch mask to expose the lower conductive element (i.e., the first wires 20). In example embodiments, each of the openings 31 may be formed to have a hole or trench shape, in plan view.

As the result of the anisotropic etching process, each of the openings 31 may be formed to have a bottom width $W_B$ smaller than a top width $W_T$. For example, the top width $W_T$ of the openings 31 may range from about 10 nm to about 60 nm, and the bottom width $W_B$ of the openings 31 may range from about 10 nm to about 50 nm. The top width $W_T$ of the openings 31 may be substantially equivalent to or smaller than a space between the openings 31. For example, the top width $W_T$ of the openings 31 may range from about 10 nm to about 60 nm, and the space between the openings 31 may range from about 10 nm to about 100 nm.

The width of each opening 31 may decrease gradually from its top end. In other words, each of the openings 31 may have an inclined sidewall. In example embodiments, the sidewall of the opening 31 and the top surface of the semiconductor substrate 10 may form an acute angle θ of about 45-90 degrees or more preferably, of about 60-80 degrees. In addition, the angle θ between the sidewall of the opening 31 and the top surface of the semiconductor substrate 10 may decrease with increasing thickness of the insulating mold layer 30.

Thereafter, an insulating spacer 33 may be formed on sidewalls of the openings 31 of the insulating mold layer 30.

The insulating spacer 33 may be formed of an insulating material having an etch selectivity with respect to the insulating mold layer 30. The insulating spacer 33 may be formed of, for example, at least one of SiON, $SiO_2$, $Si_3N_4$, SiCN, or SiC.

The formation of the insulating spacer 33 may include conformally depositing a spacer layer on the insulating mold layer 30 provided with the openings 31, and performing an etch-back process for removing the spacer layer from the top surface of the insulating mold layer 30 and a bottom surface of the opening 31. In some example embodiments, a deposition thickness of the spacer layer may be smaller than half the bottom width $W_B$ of the opening 31. According to example embodiments of the inventive concept, a contact area between the lower electrodes 40 and the conductive layers 50 may be changed depending on the deposition thickness of the spacer 33.

Figure 2B:
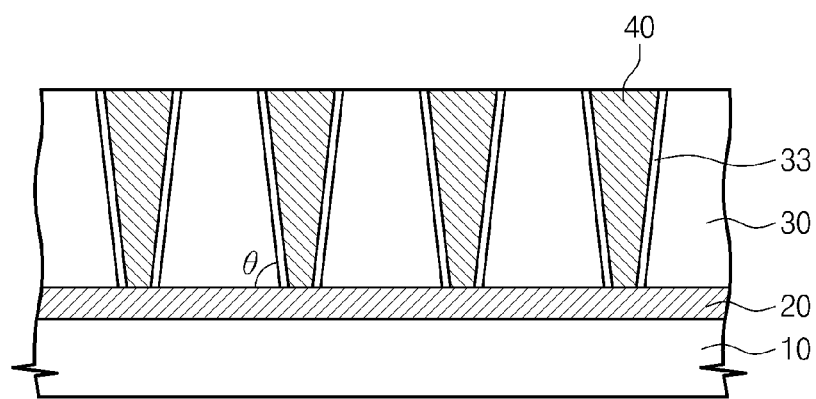

Referring to FIG. 2B, the lower electrodes 40 may be formed to fill the openings 31 provided with the insulating spacers 33. The formation of the lower electrodes 40 may include depositing a conductive layer on the insulating mold layer 30 to fill the openings 31, and then, planarizing the conductive layer. In example embodiments, the deposition of the conductive layer may be performed using one of deposition techniques having an excellent property of step coverage, such as, a physical vapor deposition (PVD), a chemical vapor deposition (CVD), or an atomic layer deposition (ALD). The planarization process may be performed using a chemical mechanical polishing (CMP) process or a dry etch back process.

The lower electrodes 40 may be formed of at least one of metal-containing nitrides, metal-containing oxynitrides, carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW), or tungsten silicide (WSix). In example embodiments, the metal-containing nitrides may include TiN, TaN, WN, MoN, NbN, TiSiN, TiAlN, TiBN, ZrSiN, WSiN, WBN, ZrAlN, MoSiN, MoAlN, TaSiN, or TaAlN, and the metal-containing oxynitrides may include TiON, TiAlON, WON, or TaON.

In the opening 31, a top width of the lower electrode 40 may be greater than a bottom width thereof. Further, the lower electrode 40 may be formed to have a width increasing with increasing distance from its bottom end. In other words, the lower electrodes 40 may have a sidewall arranged at an angle to the top surface of the semiconductor substrate 10. In some other embodiments, although not shown, the sidewall of the lower electrode 40 may be rounded and inclined.

In example embodiments, the sidewall of the lower electrode 40 and the top surface of the semiconductor substrate 10 may form an acute angle θ. The smaller the angle θ, the more easily and effectively a subsequent process of separating the conductive layers 50 may be performed. In example embodiments, the angle θ may range from about 45 to about 90 degrees, or, in a more preferred embodiment, from about 60 to about 80 degrees.

In addition, as shown in FIG. 1A, each of the lower electrodes 40 may be formed to have a circular top surface. Alternatively, as shown in FIG. 1B, each of the lower electrodes 40 may be formed to have a polygonal top surface, including, for instance, rectangular or square shaped top surfaces.

Figure 2C:
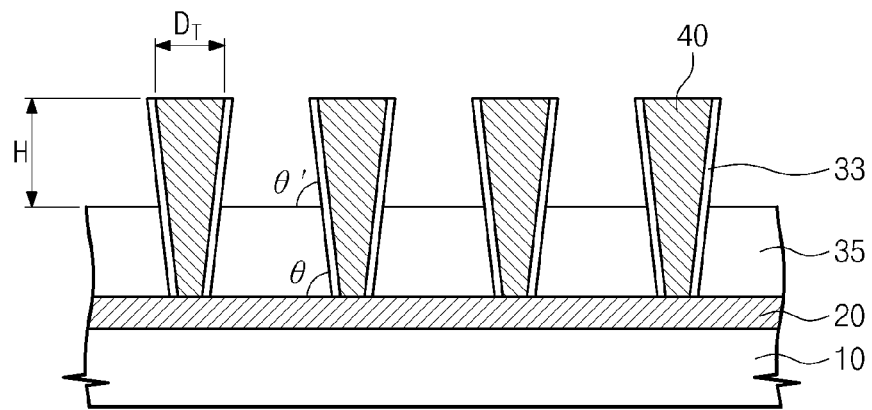

Referring to FIG. 2C, a top portion of the insulating mold layer 30 may be removed to form an insulating mold pattern 35 surrounding lower portions of the lower electrodes 40. Accordingly, the lower electrodes 40 may protrude upwardly from a top surface of the insulating mold pattern 35, and a side surface of the insulating spacer 33 may be at least partially exposed by the insulating mold pattern 35. Alternatively, if the insulating spacers 33 are not formed on the sidewalls of the lower electrodes 40, the sidewalls of the lower electrodes 40 may be at least partially exposed by the insulating mold pattern 35.

In example embodiments, the recessing of the insulating mold layer 30 may include isotropically etching the insulating mold layer 30 using an etch recipe having an etch selectivity with respect to the lower electrodes 40 and the insulating spacer 33. For example, if the insulating mold layer 30 is formed of silicon oxide, the insulating mold layer 30 may be etched, in a wet etching manner, using hydrofluoric acid, ammonium peroxide mixture (APM) (such as SC-1 solution containing $NH_4OH$, $H_2O_2$, and deionized water), or buffered oxide etchant (BOE) solution containing $HF/NH_4F$ mixture. In other embodiments, as shown in FIG. 2F, to control a height H of a protruding portion of the lower electrode 40, the etch stop layer 37 may be provided in the middle of the insulating mold layer 30. The etch stop layer 37 may be formed of an insulating material having an etch selectivity with respect to the insulating mold layer 30. In this case, a top surface of the etch stop layer 37 may be exposed after the recessing of the insulating mold layer 30.

In example embodiments, the portion of the lower electrode 40 protruding from the top surface of the insulating mold pattern 35 may have a height H greater than half the total height of the lower electrode 40. The protruding height H may be determined by a depth of a recess in the insulating mold layer 30 formed by removing the top portion of the insulating mold layer 30. According to example embodiments of the inventive concept, it is desirable that a ratio of the top width $D_T$ of the lower electrode 40 to the protruding height H be high. In example embodiments, the ratio of $D_T$ to H may range from about 1:2 to about 1:5.

Furthermore, the protruding sidewall of the lower electrode 40 and the top surface of the insulating mold pattern 35 may form an acute angle θ', which may be greater than the angle θ between the sidewall of the lower electrode 40 and the top surface of the semiconductor substrate 10. In example embodiments, the smaller the angle θ', the more easily and effectively the subsequent process of separating the conductive layers 50 may be performed. For example, the angle θ' between the lower electrode 40 and the insulating mold pattern 35 may range from about 45 to about 90 degrees, or more preferably, from about 60 to about 80 degrees.

Figure 2D:
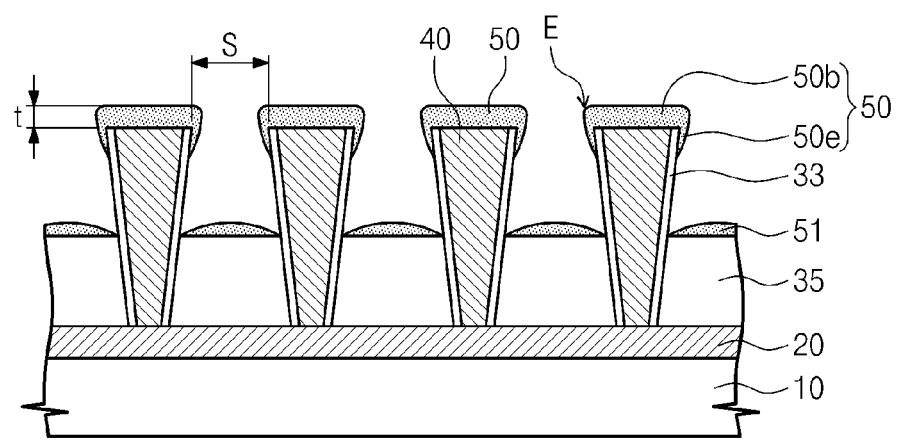

Referring to FIG. 2D, the conductive layers 50 may be formed on the lower electrodes 40, respectively. In example embodiments, the conductive layers 50 may be formed without any patterning process. Each of the conductive layers 50 may be formed to have a single-layered structure or a multi-layered structure including a plurality of layers. The formation of the conductive pattern 50 may include successively depositing a plurality of layers using a deposition technique with a poor step coverage property.

For example, the conductive layers 50 may be formed using a physical vapor deposition (PVD) process. In example embodiment, the conductive layers 50 may be formed using a sputtering process. In the sputtering process, metal atoms may be sputtered from collision between a metal target and high energy plasma (e.g., Ar ions) incident thereto and then be deposited on top surfaces of the lower electrodes 40. In other embodiments, the conductive layers 50 may be formed using a metal organic CVD (MOCVD) process, a collimated sputter process, an ionized metal PVD (IMP) process, or a combination thereof. In still other embodiments, the conductive layers 50 may be formed using a plasma-enhanced chemical vapor deposition (PE-CVD) process with a poor step coverage property.

As a result of the deposition process with poor step coverage property, the conductive layers 50 may be discontinuously deposited on the protruding portions of the lower electrodes 40 and the top surface of the insulating mold pattern 35. Due to such a discontinuous deposition, the conductive layers 50 can be formed on the lower electrodes 40 without a patterning process. The conductive layers 50 may be spaced apart from each other.

In more detail, as a result of the deposition process with poor step coverage, a thickness of a deposited layer may be smaller on a lower sidewall of the lower electrodes 40 than on an upper sidewall thereof. In addition, according to example embodiments of the inventive concept, because the width of each lower electrode 40 decreases from its top end, a deposition rate of the deposited layer may be decreased at the sidewalls of the lower electrodes 40. In example embodiments, by using physical vapor deposition, the conductive layers 50 may be formed to have step coverage of about 10% or less. Here, with respect to a deposition thickness of the conductive layers 50, step coverage may refer to a ratio of the thickness of the conductive layer 50 formed on the sidewall of the lower electrode 40 to the thickness of the conductive layer 50 formed on the top surface of the lower electrode 40. In this case, the conductive layers 50 may form patterns, which may be locally deposited on the top surfaces of the lower electrodes 40 and may be separated from each other. In addition, each of the conductive layers 50 may have a rounded edge E. For example, edge portions of the conductive layers 50 may be rounded by overhang phenomena that may occur in the PVD process. Further, due to the presence of the overhang portions of the lower magnetic patterns FP, each of the lower magnetic patterns FP may have a steeply decreasing width toward the bottom thereof.

In example embodiments, as shown in FIG. 2D, each of the conductive layers 50 may extend from the top surfaces of the lower electrodes 40 to sidewalls of the insulating spacer 33. For example, each of the conductive layers 50 may include a body portion 50b and an edge portion 50e covering the top and side surfaces, respectively, of the lower electrode 40. The thickness of the edge portion 50e of the conductive layer 50 may decrease from the top surface of the lower electrode 40 toward the bottom of the lower electrode 40.

In other example embodiments, as shown in FIG. 2F, the conductive layers 50 may not overhang the sidewall of the insulating spacer 33 and may instead be selectively formed on the top surfaces of the lower electrodes 40. In one aspect, the conductive layer 50 may be formed only on top surface(s) of a corresponding lower electrode 40 (and insulating spacer 33 where present). For example, if the lower electrode 40 has a high aspect ratio or an angle between the sidewall of the lower electrode 40 and the top surface of the insulating mold pattern 35 is increased, a thickness of the conductive layer 50 to be formed on the insulating spacer 33 may be decreased.

In addition, a deposition thickness t of the conductive pattern 50 on the top surfaces of the lower electrodes 40 may be smaller than a minimum space S between adjacently formed lower electrodes 40. For example, the deposition thickness t of the conductive layer 50 on the top surfaces of the lower electrodes 40 may range from about 50 Å to 500 Å, and the minimum space S between the lower electrodes 40 provided adjacent to each other may range from about 100 Å to 1000 Å.

Furthermore, as a result of the deposition process having poor step coverage, the same material as the conductive layer 50 may be deposited on at least a portion of the top surface of the insulating mold pattern 35 exposed between the lower electrodes 40. For example, a remaining layer 51 may be locally formed on the top surface of the insulating mold pattern 35. Here, during the deposition process having poor step coverage, the conductive layers 50 may not be deposited on the inclined sidewalls of the lower electrodes 40, and thus, the remaining layer 51 may be separated from the conductive layers 50. In addition, since the insulating spacer 33 is provided on the sidewalls of the lower electrodes 40, it is possible to substantially prevent short circuits between the lower electrodes 40, which may otherwise result from the presence of the remaining layer 51.

In example embodiment, the conductive layers 50 may include at least one of ruthenium (Ru), tantalum (Ta), palladium (Pd), titanium (Ti), platinum (Pt), silver (Ag), gold (Au), or copper (Cu). In other embodiments, each of the conductive layers 50 may include a memory element. For example, the conductive pattern 50 may include phase-change material (e.g., chalcogenide), perovskite compounds, transition metal oxides, magnetic materials, ferromagnetic materials, or antiferromagnetic materials.

Figure 2E:
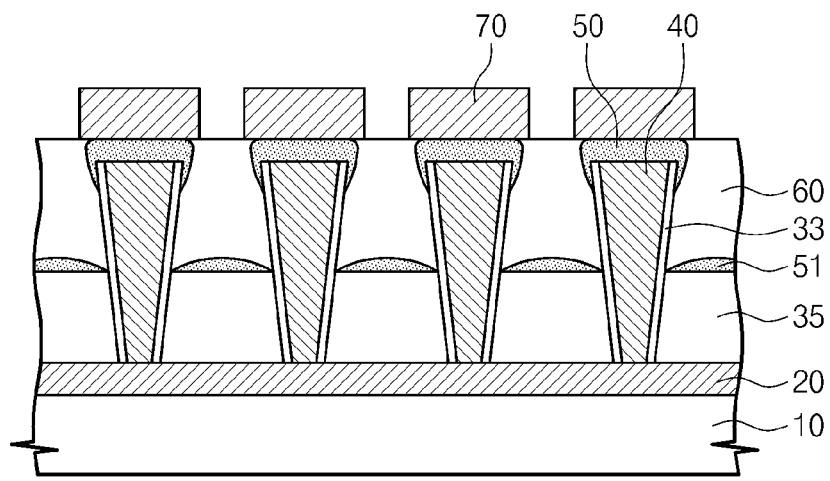
Figure 2F:
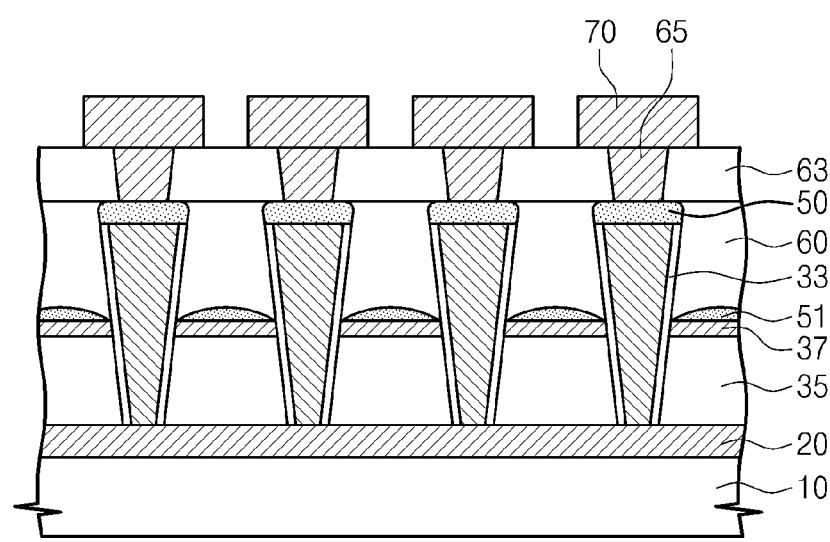

Referring to FIG. 2E, after the formation of the conductive layers 50, an insulating gap-fill layer 60 may be formed to fill a space between the lower electrodes 40 and the conductive layers 50.

The formation of the insulating gap-fill layer 60 may include forming an insulating layer to fill a space between the lower electrodes 40 and the conductive layers 50, and planarizing the insulating layer to expose top surfaces of the conductive layers 50. In example embodiments, the formation of the insulating layer may be performed using a deposition technique with a good step coverage property (for example, using PVD, CVD, or ALD process). The planarization of the insulating layer may be performed using a chemical mechanical polishing (CMP) process or a dry etch back process.

In example embodiment, as a result of the planarization process, the insulating gap-fill layer 60 may have a top surface substantially coplanar with that of the conductive layer 50. The insulating gap-fill layer 60 may be formed to be in direct contact with the sidewalls of the conductive layers 50. In other embodiments, the insulating gap-fill layer 60 may be in direct contact with the insulating spacer 33.

The insulating gap-fill layer 60 may be formed of high density plasma (HDP) oxide, TEOS (TetraEthylOrthoSilicate), PE-TEOS (Plasma Enhanced TetraEthylOrthoSilicate), $O_3$-TEOS ($O_3$-Tetra Ethyl Ortho Silicate), USG (Undoped Silicate Glass), PSG (PhosphoSilicate Glass), BSG (Borosilicate Glass), BPSG (BoroPhosphoSilicate Glass), FSG (Fluoride Silicate Glass), SOG (Spin On Glass), TOSZ (Tonen SilaZene), or any combination thereof. Alternatively, the insulating gap-fill layer 60 may be formed of silicon nitride, silicon oxynitride, or other suitable low-k dielectrics.

After the formation of the insulating gap-fill layer 60, upper conductive elements may be formed to be electrically connected to the conductive layers 50. In example embodiments, the upper conductive elements may be the second wires 70, which may extend along the second direction or along a direction crossing the first wires 20. Alternatively, as shown in FIG. 2F, the upper conductive elements may include contact plugs 65, which may be connected to the conductive layers 50 through an interlayer insulating layer 63.

Figure 3:
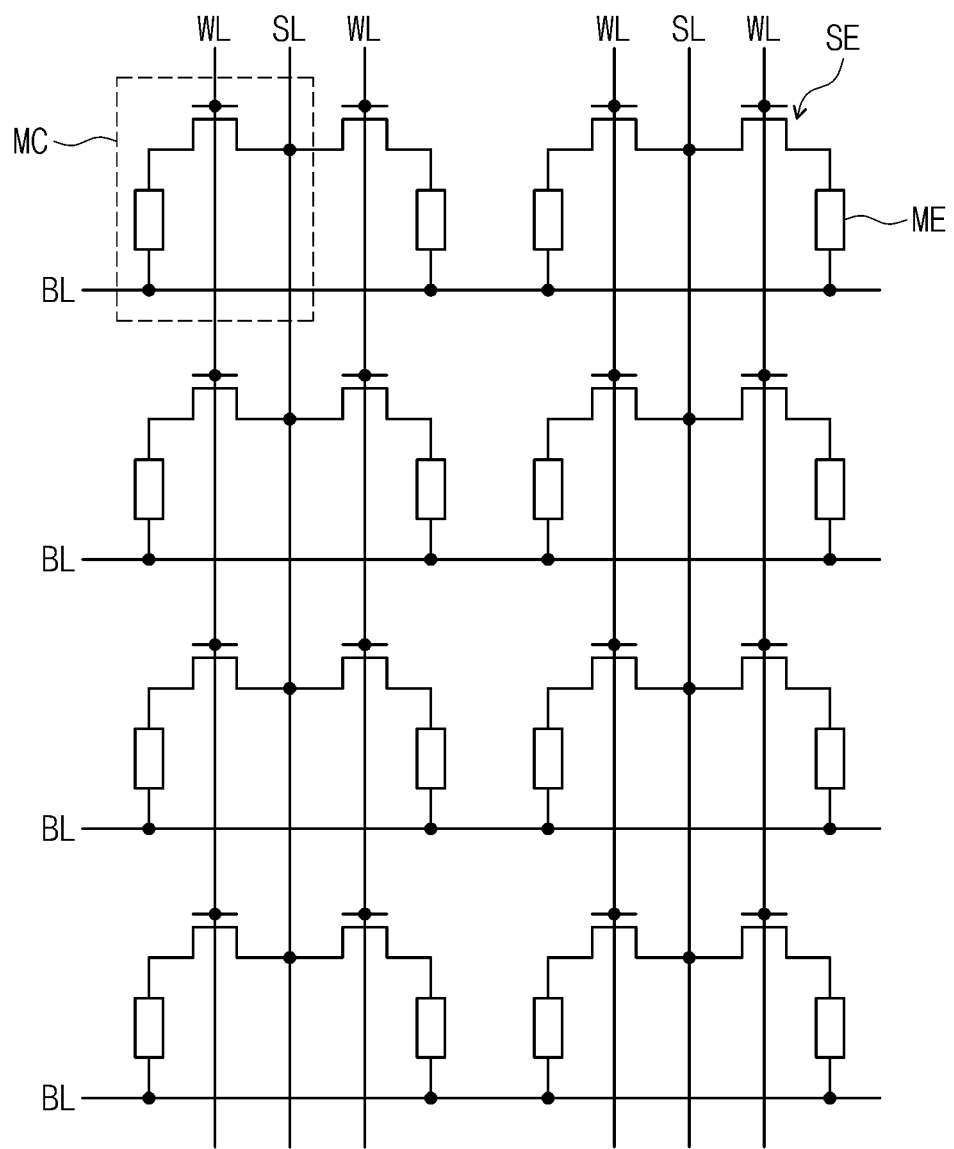
FIG. 3 is a circuit diagram illustrating a memory cell array of a magnetic memory device according to example embodiments of the inventive concept.

FIG. 3 is a circuit diagram illustrating a memory cell array of a magnetic memory device according to example embodiments of the inventive concept.

Referring to FIG. 3, a plurality of unit memory cells MC may be arranged two-dimensionally or three-dimensionally. The unit memory cells MC may be provided to connect word lines WL to bit lines BL. Each of the unit memory cells MC may include a magnetic memory element ME and a select element SE. The select element SE and the magnetic memory element ME may be electrically connected in series to each other. The magnetic memory element ME may be provided to connect the bit line BL to the select element SE, and the select element SE may be provided to connect the magnetic memory element ME and the word line WL.

The magnetic memory element ME may include a magnetic tunnel junction (MTJ). The select element SE may be configured to selectively control an electric current passing through the magnetic tunnel junction. For example, the selection element SE may be one of a diode, a PNP bipolar transistor, a NPN bipolar transistor, a NMOS field effect transistor, and a PMOS field effect transistor.

If the select element SE is a three-terminal device, such as a bipolar transistor or MOS field effect transistor, the memory cell array may further include a source line SL connected to, for example, a source electrode of the transistor. In addition, the source line SL may be provided between two adjacent word lines WL and be shared in common by two adjacent transistors.

Figure 4:
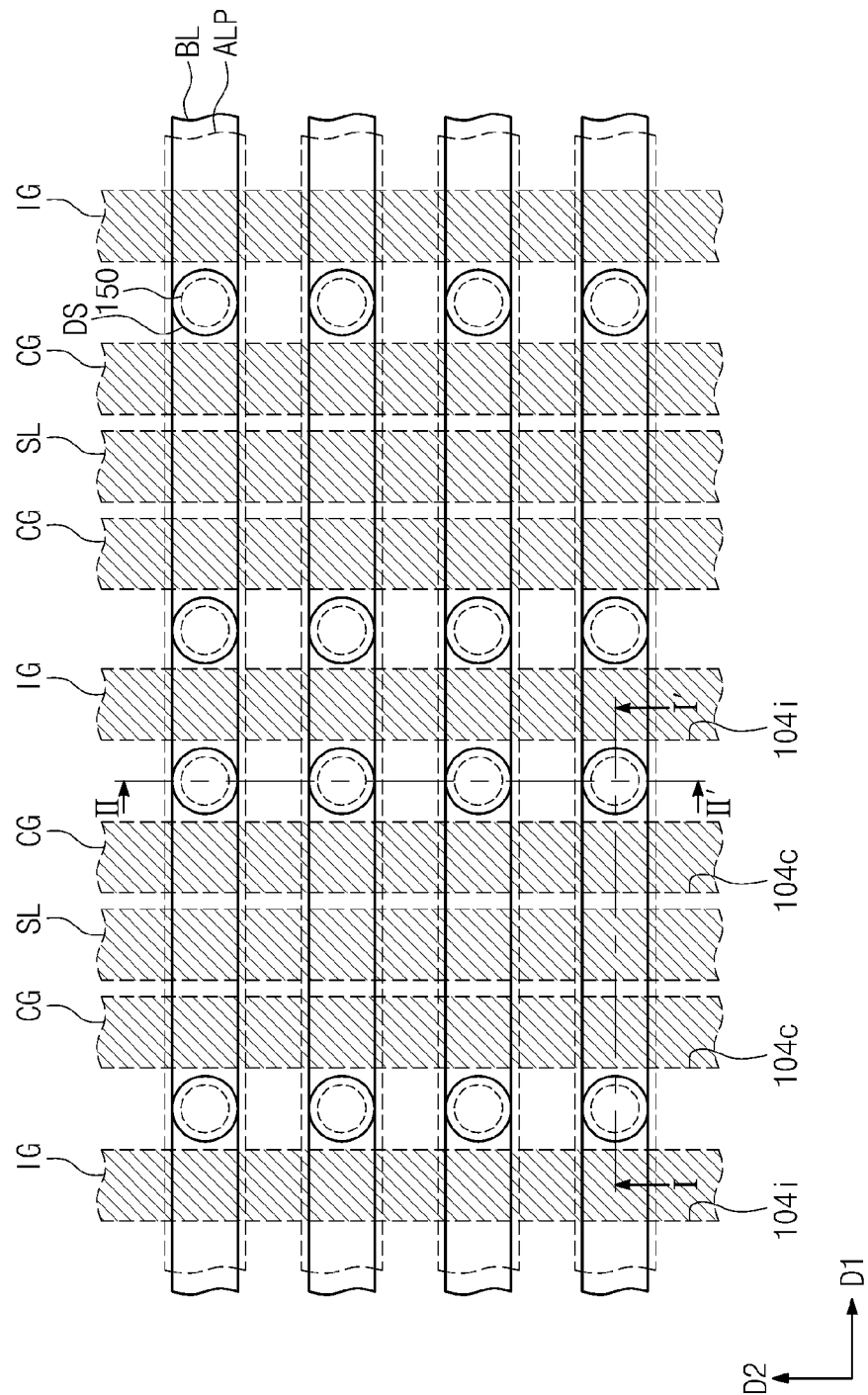
FIG. 4 is a plan view illustrating a magnetic memory device according to example embodiments of the inventive concept.
Figure 5:
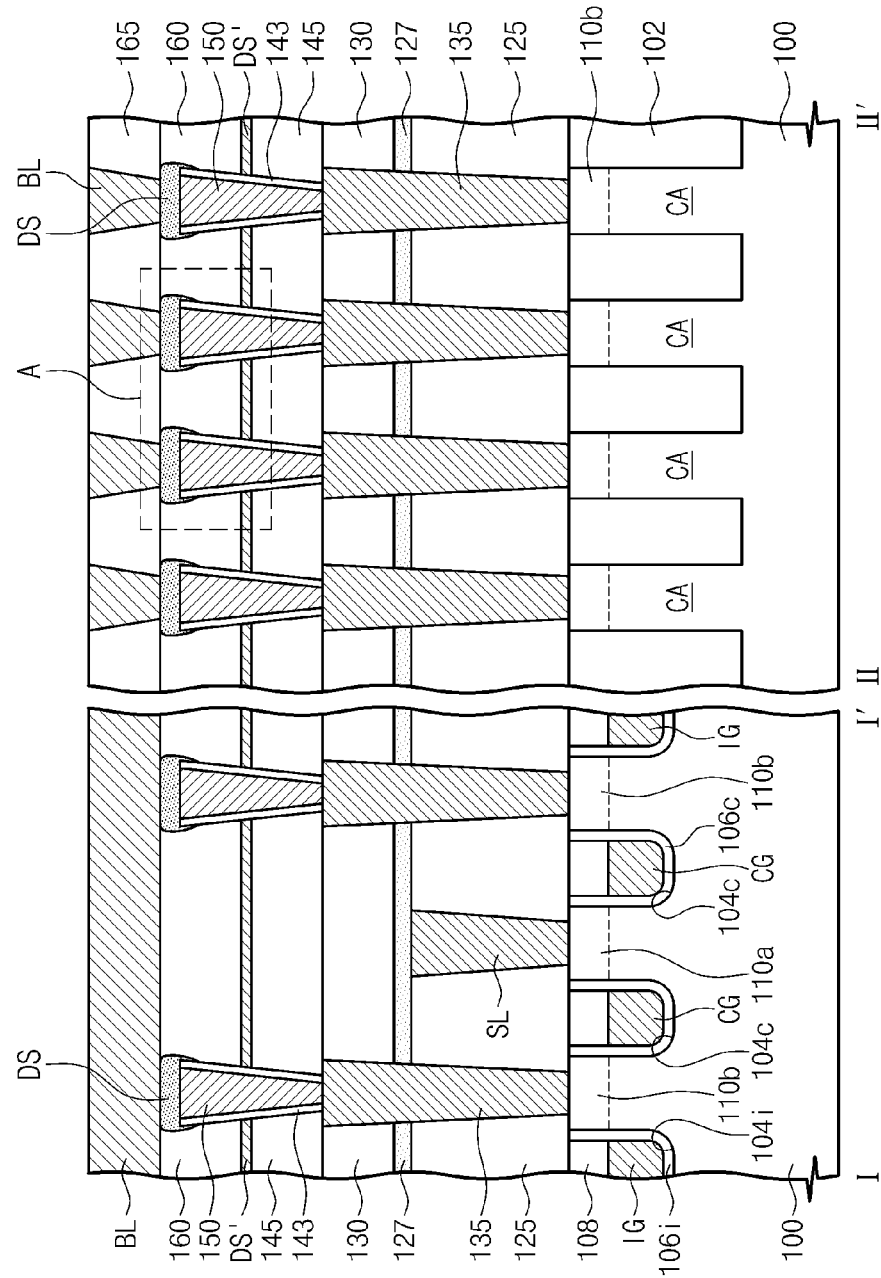
FIG. 5 is a cross-sectional view illustrating vertical sections taken along lines I-I' and II-II' of FIG. 4.

FIG. 4 is a plan view illustrating a magnetic memory device according to example embodiments of the inventive concept. FIG. 5 is a cross-sectional views illustrating vertical cross-sections taken along lines I-I' and II-II' of FIG. 4, respectively.

Referring to FIGS. 4 and 5, device isolation patterns 102 may be formed on the semiconductor substrate 100. The semiconductor substrate 100 may be a silicon wafer, a germanium wafer, and/or a silicon-germanium wafer. The device isolation patterns 102 may be formed to define active line patterns ALP. The active line pattern ALP and the device isolation patterns 102 may be alternatingly arranged in plan view. As shown in FIG. 4, in plan view, the device isolation patterns 102 and the active line patterns ALP may extend parallel to each other along a first direction. The device isolation patterns 102 and the active line patterns ALP may be alternately arranged with each other in the second direction. The active line patterns ALP may be doped to have a first conductivity type.

Isolation recess regions 104i may be formed to cross the active line patterns ALP and the device isolation patterns 102. The isolation recess regions 104i may extend along the second direction, in plan view, and each of them may be shaped like a groove (as shown in the left side of FIG. 5).

Isolation recess regions 104i may separate each of the active line patterns ALP into cell active portions CA. Each cell active portion CA may be a portion of the active line pattern ALP located between a pair of the isolation recess regions 104i adjacent to each other. For example, each cell active portion CA may be defined by a pair of the device isolation patterns 102 adjacent to each other and a pair of the isolation recess regions 104i adjacent to each other. In plan view, the cell active portions CA may be arranged in rows and in columns. Each of rows of the cell active portions CA may be arranged along the first direction, and each of columns of the cell active portions CA may be arranged along the second direction between a pair of the isolation recess regions 104i.

As shown in FIGS. 4 and 5, at least one gate recess region 104c may be formed to cross one of the columns of the cell active portions CA. The gate recess region 104c may extend parallel to the isolation recess regions 104i and each of them may be shaped like a groove. In example embodiments, a pair of the gate recess regions 104c may be formed to cross one of the columns of the cell active portions CA. In this case, a pair of the cell transistors may be formed on each cell active portion CA.

The gate recess region 104c may be formed to have a depth substantially similar to that of the isolation recess region 104i. A width of the gate recess region 104c may be the same as or different from that of the isolation recess region 104i. Each of the gate and isolation recess regions 104c and 104i may have a depth that is smaller than that of a bottom surface of the device isolation pattern 102.

Cell gate electrodes CG may be provided in the gate recess regions 104c, respectively, and a cell gate dielectric 106c may be provided between the cell gate electrode CG and the gate recess region 104c. The cell gate electrodes CG may extend along the second direction or across the active line pattern ALP, and each of them may be shaped like a line. A cell transistor with the cell gate electrode CG may use a portion of the substrate 100, which may be recessed by the gate recess region 104c, as a channel region thereof.

Isolation gate electrodes IG may be provided in the isolation recess regions 104i, respectively, and an isolation gate dielectric 106i may be provided between the isolation gate electrode IG and the isolation recess region 104i, respectively. The isolation gate electrode IG may extend along the second direction and be shaped like a line.

Gate hardmask patterns 108 may be provided on the cell and isolation gate electrodes CG and IG, respectively. The gate hardmask patterns 108 may be provided in the cell and recess regions 104 and 104i, respectively. The gate hardmask patterns 108 may have top surfaces substantially coplanar with the top surface of the semiconductor substrate 100.

When the semiconductor memory device is operated, an isolation voltage may be applied to at least one of the isolation gate electrodes IG. This helps substantially prevent an unintended channel region from being formed on an inner surface of the isolation recess region 104i. For example, isolation channel regions, which are located near each isolation gate electrode IG, may be turned off by the isolation voltage. Accordingly, the cell active portions CA in each active line pattern ALP may be electrically separated from each other. For example, if the active line pattern ALP is p-type, the isolation voltage may be a ground voltage or a negative voltage.

The cell gate electrode CG may include at least one of, for example, doped semiconductor materials (e.g., doped silicon), metals (e.g., tungsten, aluminum, titanium, and/or tantalum), conductive metal nitrides (e.g., titanium nitride, tantalum nitride, and/or tungsten nitride), or metal-semiconductor compounds (e.g., metal silicide). In example embodiments, the isolation gate electrode IG may be formed of the same material as the cell gate electrode CG. The cell gate dielectric 106c and the isolation gate dielectric 104i may include at least one of oxides (e.g., silicon oxide), nitrides (e.g., silicon nitride), oxynitrides (e.g., silicon oxynitride), and/or high-k dielectrics (such as insulating metal oxides (e.g., hafnium oxide or aluminum oxide)). The gate hardmask pattern 108 may include oxides (e.g., silicon oxide), nitrides (e.g., silicon nitride) and/or oxynitrides (e.g., silicon oxynitride).

A first doped region 110a may be formed in each cell active portion CA at a side of each cell gate electrode CG, and a second doped region 110b may be formed in each cell active portion CA at another (opposite) side of each cell gate electrode CG. In example embodiment, the first doped region 110a may be formed in each cell active portion CA between a pair of the cell gate electrodes CG, and a pair of the second doped regions 110b may be formed in peripheral portions of each cell active portion CA with the pair of the cell gate electrodes CG disposed therebetween. For example, the pair of the cell transistors formed in each cell active portion CA may share the first doped region 110a. The first and second doped regions 110a and 110b may serve as source/drain regions of as the cell transistor. The first and second doped regions 110a and 110b may be doped to have a second conductivity type different from the first conductivity type of the cell active portion CA. One of the first and second conductivity types may be n-type, and the other p-type.

Referring to FIGS. 4 and 5, a first interlayer insulating layer 125 may be formed on the semiconductor substrate 100. The source lines SL may be formed to fill source-grooves that may be formed in the first interlayer insulating layer 125. The source lines SL may extend along the second direction. Each source line SL may be electrically connected to the first doped regions 110a arranged along the second direction. The top surface of the source line SL may be substantially coplanar with that of the first interlayer insulating layer 125. The source line SL may include at least one of, for example, doped semiconductor materials (e.g., doped silicon), metals (e.g., tungsten, aluminum, titanium, and/or tantalum), conductive metal nitrides (e.g., titanium nitride, tantalum nitride, and/or tungsten nitride), or metal-semiconductor compounds (e.g., metal silicide).

A capping interlayer insulating layer 127 may be provided on the first interlayer insulating layer 125. The capping interlayer insulating layer 127 may be formed to cover the top surfaces of the source lines SL. If the source lines SL include a metal, the capping interlayer insulating layer 127 may be formed of an insulating material capable of substantially preventing metallic atoms from being diffused from the source lines SL to a second interlayer insulating layer 130. In addition, the capping interlayer insulating layer 127 may be formed of an insulating material having an etch selectivity with respect to the first interlayer insulating layer 125. For example, the first interlayer insulating layer 125 may be formed of oxide (e.g., silicon oxide), and the capping interlayer insulating layer 127 may be formed of nitride (e.g., silicon nitride) and/or oxynitride (e.g., silicon oxynitride).

The second interlayer insulating layer 130 may be provided on the capping interlayer insulating layer 127. The second interlayer insulating layer 130 may be formed of oxide (e.g., silicon oxide).

Contact plugs 135 may be provided to penetrate the second interlayer insulating layer 130, the capping interlayer insulating layer 127, and the first interlayer insulating layer 125. The contact plugs 135 may be electrically connected to the second doped regions 110b, respectively. In example embodiments, ohmic patterns (not shown) may be provided between the contact plugs 135 and the second doped regions 110b and between the source lines SL and the first doped regions 110a. The ohmic patterns may include metal-semiconductor compound, such as metal silicide (e.g., cobalt silicide or titanium silicide).

As shown in FIGS. 4 and 5, an insulating mold pattern 145 may be disposed on the second interlayer insulating layer 130.

Lower electrodes 150 may be provided in openings, respectively, which expose the contact plugs 135 through the insulating mold pattern 145. The lower electrodes 150 may protrude upwardly from the top surface of the insulating mold pattern 145. In some embodiments, a ratio of the maximum width (e.g., an upper width) of the lower electrode 150 to a height difference between top surfaces of the lower electrode 150 and the insulating mold pattern 145 may range from about 1:2 to about 1:5. In example embodiments, as a length of a protruding portion of the lower electrodes 150 from the top surface of the insulating mold pattern 145 increases, data storage layers DS may be more easily separated from each other on the lower electrodes 143.

Furthermore, a width of the lower electrode 150 may taper from the top surface of the insulating mold pattern 145. In other words, an upper width of the lower electrode 150 may be greater than a lower width thereof. Accordingly, the lower electrodes 150 may have a sidewall arranged at an angle with respect to the top surface of the semiconductor substrate 100. The sidewall of the lower electrode 150 and the top surface of the insulating mold pattern 145 may form an acute angle. For example, the sidewall of the lower electrode 150 may form an angle of about 45 to 90 degrees, (and more preferably, of about 60 to 80 degrees) with respect to the top surface of the insulating mold pattern 145.

In addition, an insulating spacer 143 may be provided on the sidewalls of the lower electrodes 150. The insulating spacers 143 may be formed of an insulating material having an etch selectivity with respect to the insulating mold pattern 145.

In example embodiments, data storage layers DS may be provided on the lower electrodes 150, respectively. The data storage layers DS may be coupled to the lower electrodes 150, respectively. For example, the data storage layers DS may be electrically coupled to the second doped regions 110b through the lower electrodes 150 and the contact plugs 135, respectively. As shown in FIG. 4, the data storage layers DS may be arranged in rows and in columns in plan view.

The data storage layers DS may be formed using a deposition technique having a poor step coverage property, such as a physical vapor deposition (PVD) process.

In more detail, as described with reference to FIG. 2D, the data storage layer DS may include may include a body portion covering the top surface of the lower electrode 150 and an edge portion covering the side surface of the sidewall spacer 143. The body portion of data storage layer DS may be formed to have a thickness smaller than half the minimum space between the lower electrodes 150. The thickness of the edge portion of the data storage layer DS may decrease toward the bottom of the lower electrode 150. As a result of the PVD process, the data storage layer DS may have a rounded profile or rounded edge near an upper corner of the lower electrodes 150.

In addition, the remaining data storage layer DS' may remain on the insulating mold pattern 145 between the adjacent lower electrodes 150. The remaining data storage layer DS' may be formed of the same material as the data storage layer DS, and the remaining data storage layer DS' may be thinner than the data storage layer DS provided on the top surface of the lower electrode 150.

The data storage layer DS may be formed of at least one material configured to store data therein. For example, the data storage layer DS may include at least one of variable resistance materials, whose resistance can be selectively changed by an electric current passing therethrough. In addition, the data storage layer DS may be formed to have a single- or multi-layered structure.

In example embodiment, the data storage layer DS may have a multi-layered structure, whose resistance can be changed using a spin-transfer torque effect of an electric current passing therethrough. For example, the data storage layer DS may have a multi-layered structure configured to exhibit a magneto-resistance property and include at least one ferromagnetic material and/or at least one antiferromagnetic material.

In other example embodiments, the data storage layer DS may include a phase-change material (e.g., chalcogenide), whose crystal state can be changed by an amount of an electric current passing therethrough. For example, the data storage layer DS may include at least one of antimony (Sb), tellurium (Te), or selenium (Se). In example embodiments, the data storage layer DS may include at least one of binary chalcogenide compounds (e.g., GaSb, InSb, InSe, $Sb_2Te_3$, or GeTe), ternary chalcogenide compounds (e.g., GeSbTe, GaSeTe, InSbTe, $SnSb_2Te_4$, or InSbGe), or quaternary chalcogenide compounds (e.g., AgInSbTe, (GeSn)SbTe, GeSb (SeTe), or $Te_{81}Ge_{15}Sb_2S_2$).

In still other embodiments, the data storage layer DS may include at least one of materials, whose resistance state can be reversibly switched to one of two different values by applying a specific voltage to both ends thereof. For example, the data storage layer DS may include at least one of insulating materials exhibiting a perovskite crystal phase or transition metal oxides. For example, the insulating materials exhibiting perovskite crystal phase may be insulating materials of $ABO_3$ structure (such as, $PbZrTiO_3$, $PrCaMnO_3$, calcium-doped (Ba, Sr)$TiO_3$, and $SrZrO_3$), but example embodiments of the inventive concepts may not be limited thereto. The transition metal oxides may include at least one of niobium oxide, titanium oxide, nickel oxide, zirconium oxide, vanadium oxide, PCMO ((Pr,Ca)$MnO_3$), strontium-titanium oxide, barium-strontium-titanium oxide, strontium-zirconium oxide, barium-zirconium oxide, or barium-strontium-zirconium oxide.

In example embodiments, the data storage layer DS may include a plurality of magnetic layers stacked on the lower electrode. This will be described in more detail with reference to FIGS. 6, 7A through 7C, 8, and 9.

Referring to FIGS. 4 and 5, an insulating gap-fill layer 160 may be formed to fill a space between the lower electrodes 150 and the data storage layers DS. The insulating gap-fill layer 160 may be formed to be in direct contact with at least a portion of each data storage layer DS. In addition, the insulating gap-fill layer 160 may have a top surface substantially coplanar with the top surfaces of the data storage layers DS. The insulating gap-fill layer 160 may be in direct contact with the insulating spacer 143 covering the sidewall of the lower electrode 150 and cover the remaining data storage layer DS'.

A third interlayer insulating layer 165 may be provided on the data storage layers DS and the insulating gap-fill layer 160. The third interlayer insulating layer 165 may be formed to have a single- or multi-layered structure.

In some embodiments, the bit line BL may be provided in a groove formed through the third interlayer insulating layer 165. The bit line BL may be in direct contact with a top surface of the data storage layer DS. The bit line BL may be overlapped with the active line pattern ALP in plan view. In other example embodiments, upper electrodes (not shown), instead of the bit lines BL, may be connected to the data storage layers DS, respectively.

Figure 6:
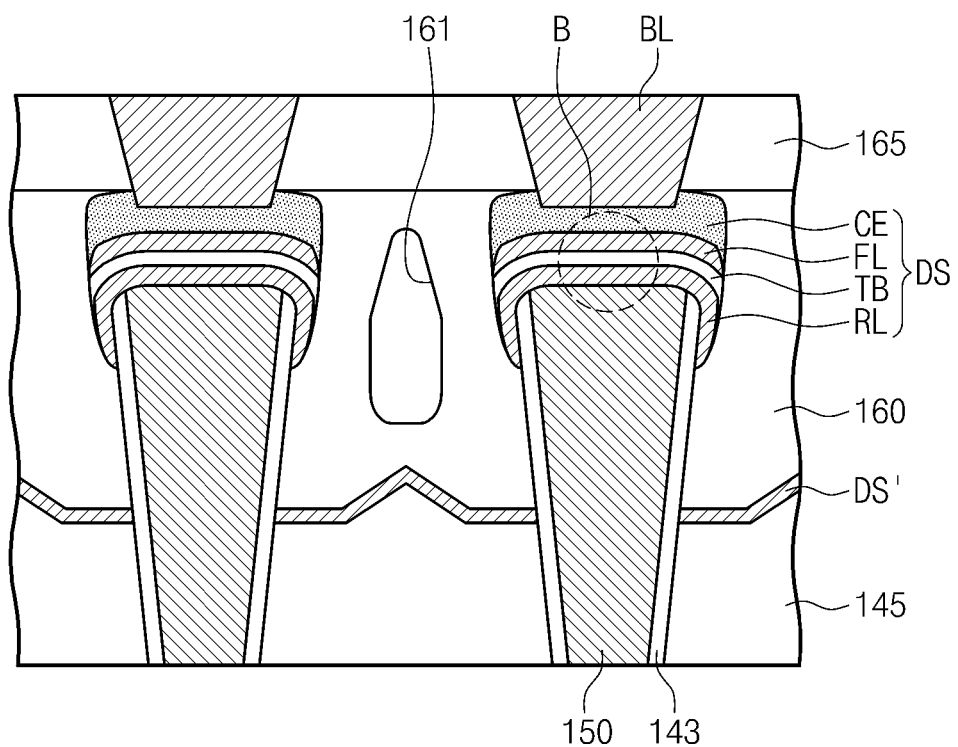
FIG. 6 is an enlarged cross-sectional view of a portion A of FIG. 5 and illustrating in more detail a magnetic memory device according to example embodiments of the inventive concept.

FIG. 6 is an enlarged cross-sectional view of a portion A of FIG. 5B, illustrating in greater detail a magnetic memory device according to example embodiments of the inventive concept.

Referring to FIG. 6, each of the data storage layers DS may include a magnetic tunnel junction having a plurality of magnetic layers and a tunnel barrier layer TB disposed therebetween. One of the magnetic layers may be a reference magnetic layer RL having a fixed magnetization direction. Another of the magnetic layers may be a free magnetic layer FL whose magnetization direction can be easily changed by an external magnetic field. In addition, the data storage layer DS may further include a capping electrode layer CE provided on the uppermost one of the magnetic layers.

Electrical resistance of the magnetic tunnel junction may be much greater when magnetization directions of the reference and free layers are antiparallel to each other than when they are parallel to each other. In other words, the electrical resistance of the magnetic tunnel junction may be controlled by changing the magnetization direction of the free layer. This resistance characteristics of the magnetic tunnel junction may be used as a data storing mechanism of the data storage layer DS in each memory cell MC of FIG. 3.

In some embodiments, as described with reference to FIG. 5, the data storage layer DS may include a body portion and an edge portion covering the top and side surfaces, respectively, of the lower electrode. The thickness of the edge portion may decrease toward the bottom of the lower electrode 150. The edge portion exposes the insulating spacer 143 provided on the sidewall of the lower electrode 150. In an example embodiment, the lowest point of the data storage layer DS may be located below the uppermost point of the lower electrode 150.

In more detail, the reference magnetic layer RL may be formed to be in direct contact with the lower electrode 150 and include the body and edge portions covering the top and side surfaces, respectively, of the lower electrode 150. The free magnetic layer FL may be formed spaced apart from the lower electrode 150, and the tunnel barrier layer TB may be provided on the body portion of the reference magnetic layer RL. The free magnetic layer FL and the tunnel barrier layer TB may cover at least a portion of the edge portion of the reference magnetic layer RL but the reference and free magnetic layers RL and FL may be formed spaced apart from each other. The capping electrode layer CE may be formed spaced apart from the reference magnetic layer RL. Each of the reference and free magnetic layers RL and FL, the tunnel barrier layer TB, and the capping electrode layer CE may be formed using a deposition process with a poor step coverage property, and thus, it may have a rounded corner.

The insulating gap-fill layer 160 may be formed to fill a space between the data storage layers DS and be in direct contact with the insulating spacer 143. Accordingly, the remaining data storage layer DS' may be localized below the insulating gap-fill layer 160 and separated or isolated from the data storage layers DS. In an example embodiment, the insulating gap-fill layer 160 may be formed to have an air gap 161 therein. In other words, the air gap may be provided between the data storage layers DS.

Furthermore, the insulating gap-fill layer 160 may be in direct contact with sidewalls of the data storage layers DS. For example, the insulating gap-fill layer 160 may be in direct contact with at least one of the reference and free magnetic layers RL and FL and the tunnel barrier layer TB constituting each of the data storage layers DS.

Figure 7A:
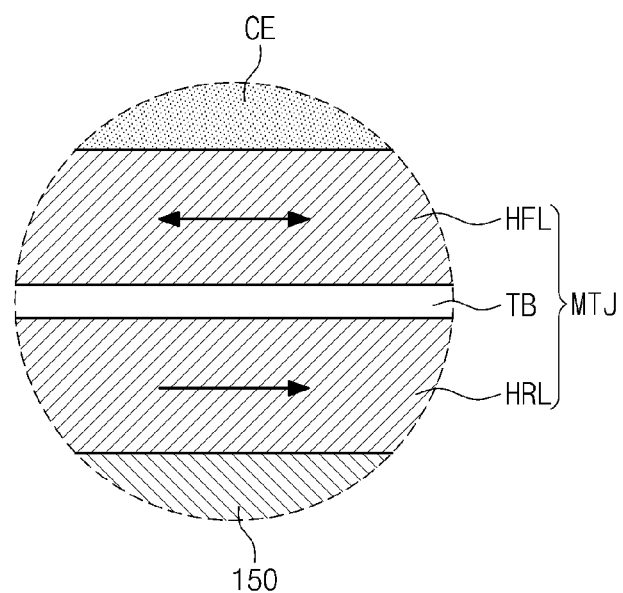
FIGS. 7A through 7C are enlarged cross-sectional views of a portion B of FIG. 6 and illustrating in more detail memory elements of the magnetic memory device according to example embodiments of the inventive concept.
Figure 7B:
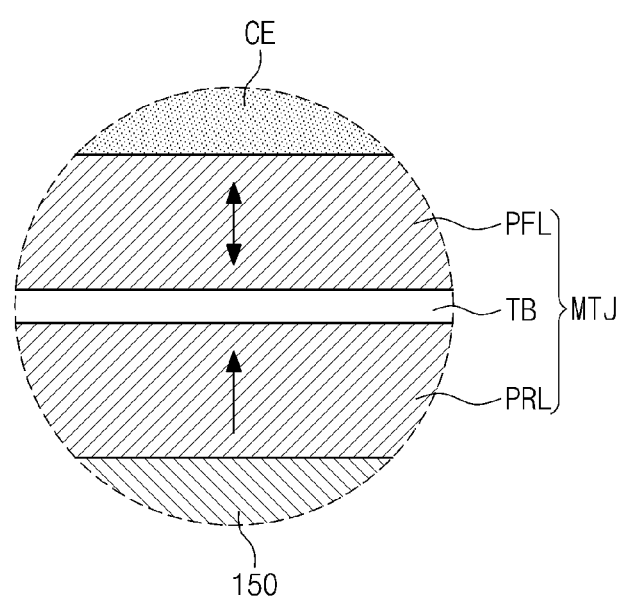
Figure 7C:
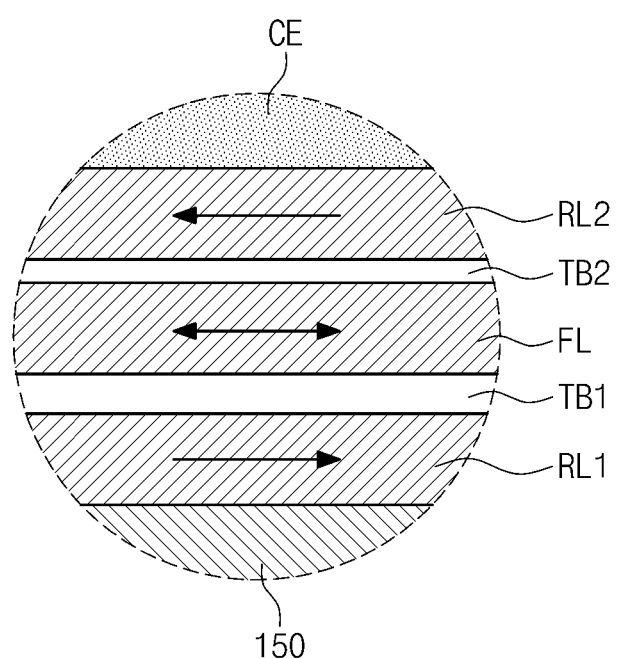

FIGS. 7A through 7C are enlarged cross-sectional views of a portion B of FIG. 6 and illustrating in more detail memory elements of the magnetic memory device according to example embodiments of the inventive concept.

Referring to FIG. 7A, the data storage layer DS may include a magnetic tunnel junction. The magnetic tunnel junction may include a reference magnetic layer HRL, a free magnetic layer HFL, and a tunnel barrier layer TB disposed therebetween.

The reference magnetic layer HRL may have a fixed magnetization direction, and the free magnetic layer HFL may have a magnetization direction that can be changed to be parallel or antiparallel to that of the reference magnetic layer HRL. In example embodiments, the reference and free magnetic layers HRL and HFL may have in-plane magnetization directions or be parallel to the tunnel barrier layer TB.

When the free magnetic layer HFL has a magnetization direction parallel to that of the reference magnetic layer HRL, the data storage layer DS may have a first resistance. When the free magnetic layer HFL has a magnetization direction antiparallel to that of the reference magnetic layer HRL, the data storage layer DS may have a second resistance greater than the first resistance. This difference in resistance may be used as a data storing mechanism of the data storage layer DS. In example embodiments, the magnetization direction of the free magnetic layer HFL may be changed using spin torque transfer phenomena of electrons in a programming step.

The reference magnetic layer HRL and the free magnetic layer HFL may include a ferromagnetic material. The reference magnetic layer HRL may further include an antiferromagnetic material pinning the magnetization direction of the ferromagnetic material in the reference magnetic layer HRL. The tunnel barrier TB may include at least one of magnesium oxide, titanium oxide, aluminum oxide, magnesium-zinc oxide, or magnesium-boron oxide.

As shown in FIG. 7B, a magnetic tunnel junction of the data storage layer DS may include a perpendicular reference magnetic layer PRL, a perpendicular free magnetic layer PFL, and a tunnel barrier PTB interposed therebetween. The perpendicular reference magnetic layer PRL may have a fixed magnetization direction, while the perpendicular free magnetic layer PFL may have a magnetization direction that can be changed to be parallel or antiparallel to that of the perpendicular reference magnetic layer PRL. In example embodiments, the perpendicular reference and free magnetic layers PRL and PFL may be configured to have magnetization directions substantially perpendicular to the tunnel barrier PTB.

The perpendicular reference and free magnetic layers PRL and PFL may include at least one of perpendicular magnetic materials (e.g., CoFeTb, CoFeGd, or CoFeDy), perpendicular magnetic materials having $L1_0$ structure, CoPt with the hexagonal close packing (HCP) structure, or perpendicular magnetic structures. The perpendicular magnetic materials having $L1_0$ structure may include at least one of FePt having $L1_0$ structure, FePd having $L1_0$ structure, CoPd having $L1_0$ structure, or CoPt having $L1_0$ structure. The perpendicular magnetic structures may include magnetic and non-magnetic layers that are alternatingly and repeatedly stacked. For example, the perpendicular magnetic structures may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where the subscript n denotes the stacking number. Here, the perpendicular reference magnetic layer PRL may be thicker than the perpendicular free magnetic layer PFL, and/or the perpendicular reference magnetic layer PRL may have a coercive force that is higher than that of the perpendicular free magnetic layer PFL. The tunnel barrier PTB may include at least one of magnesium oxide, titanium oxide, aluminum oxide, magnesium-zinc oxide, or magnesium-boron oxide.

According to the embodiment shown in FIG. 7C, the data storage layer DS may include a first magnetic tunnel junction and a second magnetic tunnel junction.

For example, the data storage layer DS may include a first reference magnetic layer RL1, a first tunnel barrier layer TB1, the free magnetic layer FL, a second tunnel barrier layer TB2, and a second reference magnetic layer RL2, which are sequentially stacked. The first and second tunnel barrier layers TB1 and TB2 may have difference thicknesses from each other. In the data storage layer DS, the first reference magnetic layer RL1, the first tunnel barrier layer TB1, and the free magnetic layer FL may constitute the first magnetic tunnel junction. And the free magnetic layer FL, the second tunnel barrier layer TB2, and the second reference magnetic layer RL2 may constitute the second magnetic tunnel junction.

The first and second reference magnetic layers RL1 and RL2 may have fixed magnetization directions, and the free layer FL may have a magnetization direction that can be changed to be parallel or antiparallel to those of the first and second reference magnetic layers RL1 and RL2. Magnetization directions of the first and second reference magnetic layers RL1 and RL2 and the free magnetic layer FL may be substantially parallel or perpendicular to top surfaces of the first and second tunnel barrier layers TB1 and TB2.

Figure 8:
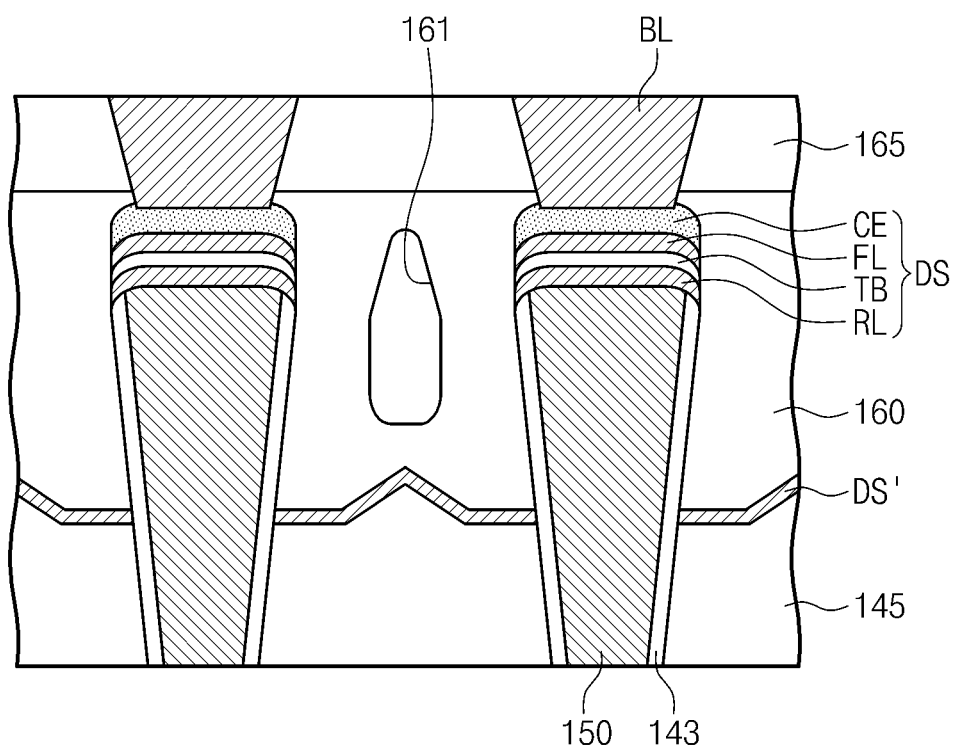
FIG. 8 is an enlarged cross-sectional view of a portion A of FIG. 5 and illustrating in more detail a magnetic memory device according to other example embodiments of the inventive concept.

FIG. 8 is an enlarged cross-sectional view of a portion A of FIG. 5 and illustrating in more detail a magnetic memory device according to other example embodiments of the inventive concept.

In some embodiments, the principles of the present disclosure can be applied to either in-plane and perpendicular STT-RAM devices or to combinations of in-plane and perpendicular STT-RAM devices (e.g., devices in which the free layer has a high perpendicular anisotropy while the equilibrium magnetic moment of the free layer remains in-plane). One example of such a device may be seen in U.S. Pat. No. 6,992,359, the contents of which are incorporated herein by reference in their entirety.

According to the embodiment shown in FIG. 8, if a ratio of the maximum width of the lower electrode 150 to a protruding height of the lower electrode 150 from the top surface of the insulating mold pattern 143 increases, the data storage layers DS may be easily localized on the lower electrodes 150 and adjacent ones of them may be easily separated from each other. In this case, the data storage layer DS may not be formed on the sidewall of the insulating spacer 143 (or the sidewall of the lower electrodes 150) and be localized on the top surfaces of the lower electrodes 150.

Further, the data storage layers DS may be formed to have a rounded corner or rounded edge near an upper corner of the lower electrode 150.

In the present embodiment, as described with reference to FIG. 6, each of the data storage layers DS may include the reference magnetic layer RL, the tunnel barrier layer TB, and the free magnetic layer FL, which may be sequentially stacked on the lower electrode 150.

Figure 9:
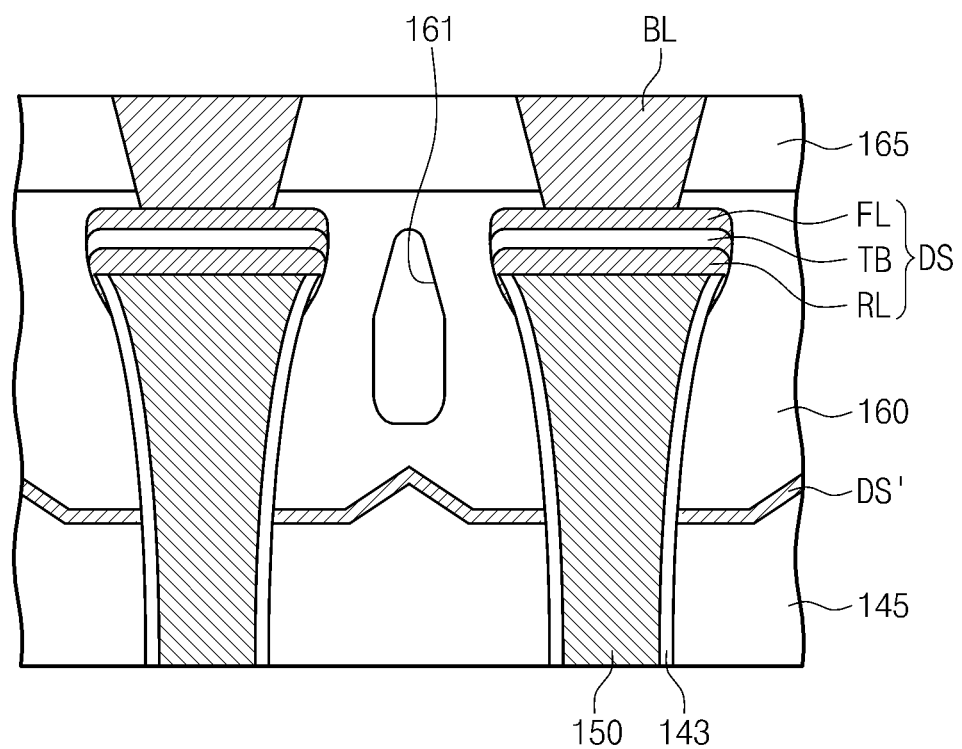
FIG. 9 is an enlarged cross-sectional view of a portion A of FIG. 5 and illustrating in more detail a magnetic memory device according to still other example embodiments of the inventive concept.

FIG. 9 is an enlarged cross-sectional view of a portion A of FIG. 5 and illustrating in more detail a magnetic memory device according to still other example embodiments of the inventive concept.

Referring to FIG. 9, the lower electrode 150 may be formed to have a top width that is greater than a bottom width and to have a rounded sidewall or curved sidewall. As described with reference to FIG. 6, the data storage layer DS may include a body portion and an edge portion covering the top and side surfaces, respectively, of the lower electrode 150. The thickness of the edge portion decrease toward the bottom of the lower electrode 150. The edge portion may expose the insulating spacer 143 provided on the sidewall of the lower electrode 150. The data storage layer DS may include the reference magnetic layer RL, the tunnel barrier layer TB, and the free magnetic layer FL, which may be sequentially stacked on the lower electrode 150. The free magnetic layer FL may be formed to be in direct contact with the bit line BL or the contact plug connected to the bit line BL.

FIGS. 10 through 16 are cross-sectional views illustrating a method of fabricating a magnetic memory device according to example embodiments of the inventive concept.

Figure 10:
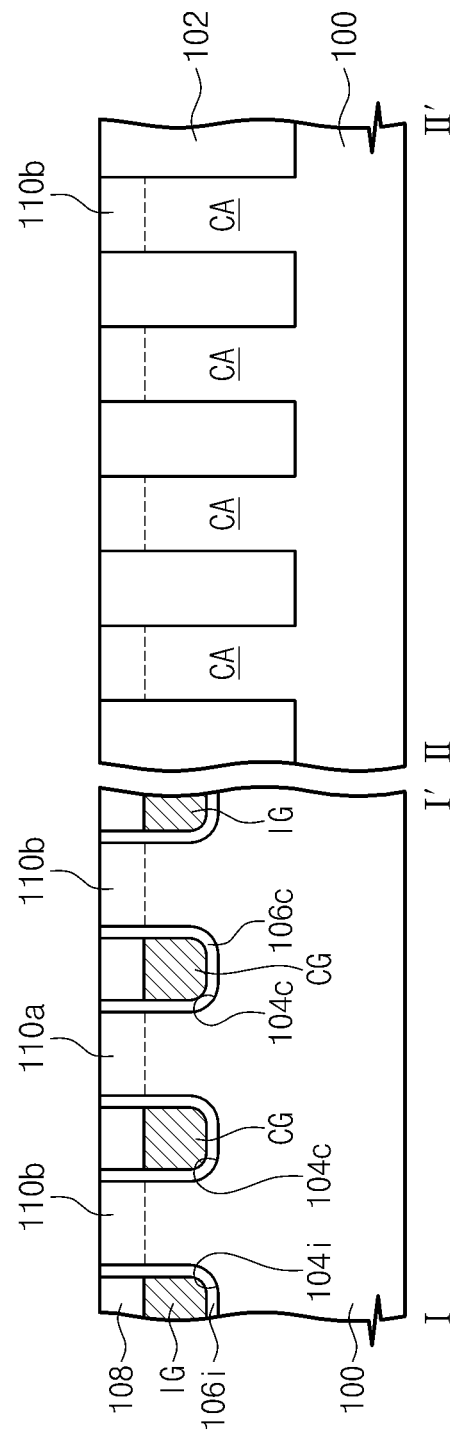
FIGS. 10 through 16 are cross-sectional views illustrating a method of fabricating a magnetic memory device according to example embodiments of the inventive concept.

Referring to FIGS. 4 and 10, the device isolation patterns 102 may be formed on the semiconductor substrate 100 to define the active line patterns ALP. The active line patterns ALP may be formed to extend along the first direction.

The active line patterns ALP and the device isolation patterns 102 may be patterned to form the gate recess regions 104c and the isolation recess regions 104i extending along the second direction perpendicular to the first direction. Each of the isolation recess regions 104i may be formed to divide each active line pattern ALP into a plurality of the cell active portions CA. The gate recess regions 104c may be formed to cross the cell active portions CA. Each of the gate and isolation recess regions 104c and 104i may be formed to have a depth smaller than a depth of a bottom surface of the device isolation pattern 102.

The cell gate dielectric 106c may be formed on an inner surface of each gate recess region 104c to have a substantially uniform thickness. The isolation gate dielectric 106i may be formed on an inner surface of each isolation recess region 104i to have a substantially uniform thickness. In example embodiments, the cell and isolation gate dielectrics 106c and 106i may be simultaneously formed using the same process.

Thereafter, a conductive layer may be formed to fill the recess regions 104c and 104i. The conductive layer may be etched to form the cell gate electrode CG in each gate recess region 104c and the isolation gate electrode IG in each isolation recess region 104i. The cell gate electrode CG and the isolation gate electrode IG may be recessed to have top surfaces that are lower than that of the semiconductor substrate 100.

A hard mask layer may be formed on the semiconductor substrate 100 to fill the recess regions 104c and 104i provided with the cell and isolation gate electrodes CG and IG. The hard mask layer may be planarized to form gate hardmask patterns 108 in the recess regions 104c and 104i.

Dopants may be injected into portions of the cell active portions CA at both sides of the cell gate electrodes CG to form the first doped regions 110a and the second doped regions 110b. The first and second doped regions 110a and 110b may be formed to have bottom surfaces higher than the bottom surface of the cell gate electrode CG.

Figure 11:
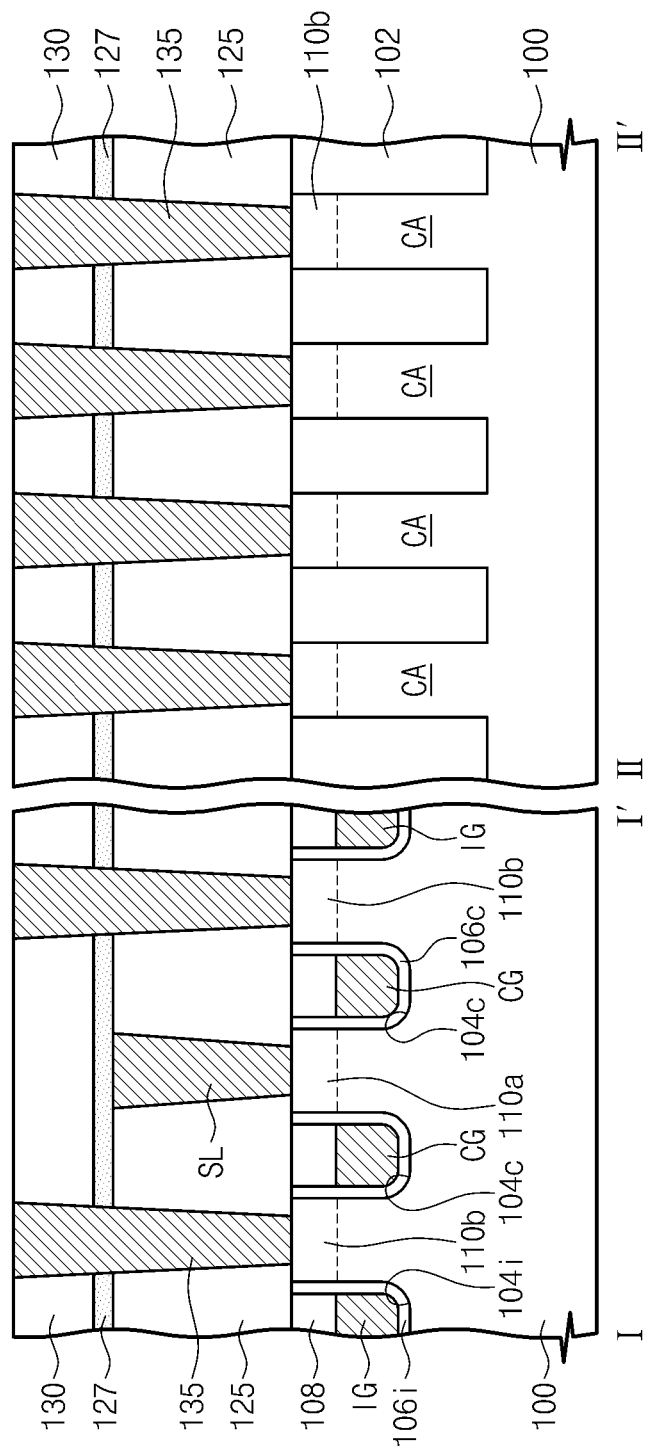

Referring to FIG. 11, the first interlayer insulating layer 125 may be formed on the semiconductor substrate 100. The first interlayer insulating layer 125 may be patterned to form the source grooves. A conductive layer may be formed to fill the source groove, and then, the conductive layer may be planarized to expose the second interlayer insulating layer 125 and to form the source line SL in the source groove. The source line SL may be connected to the first doped region 102a.

Thereafter, the capping interlayer insulating layer 127 may be formed on the first interlayer insulating layer 125 and the source line SL. The second interlayer insulating layer 130 may be formed on the capping interlayer insulating layer 127. The contact plugs 135 may be formed through the second interlayer insulating layer 130, the capping interlayer insulating layer 127, and the first interlayer insulating layer 125. The contact plugs 135 may be connected to the second doped regions 110b, respectively.

Figure 12:
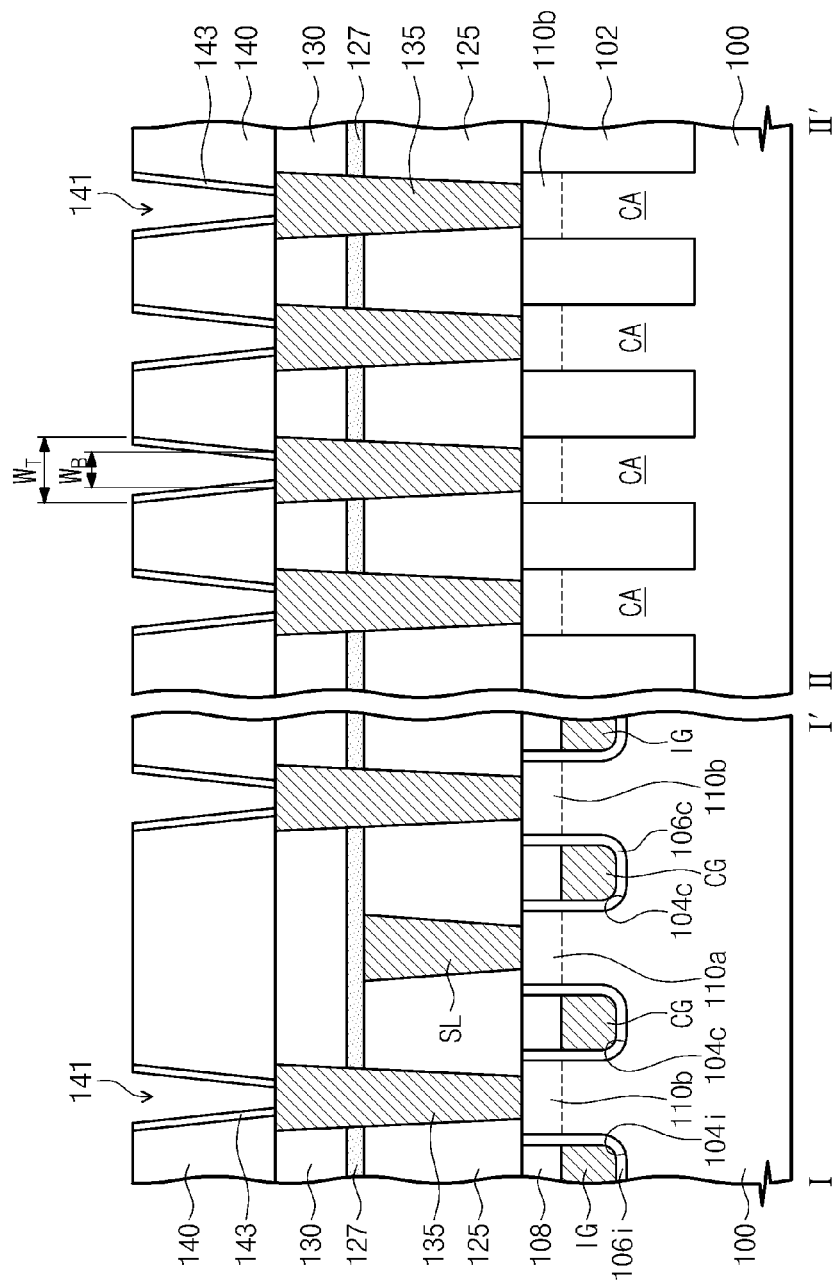

Referring to FIG. 12, an insulating mold layer 140 with openings exposing the contact plugs 135 may be formed on the second interlayer insulating layer 130.

In example embodiment, the insulating mold layer 140 may be formed to have a single-layer structure. Alternatively, the insulating mold layer 140 may be formed to have a multi-layer structure including a plurality of insulating layers, which may be alternatingly stacked one on another, and at least one of which has an etch selectivity with respect to other insulating layers. For example, as shown in FIG. 2F, the insulating mold layer 140 may include an etch stop layer. In other example embodiments, the insulating mold layer 140 may be formed of a doped insulating layer (e.g., phosphosilicate glass (PSG), borosilicate glass (BSG), boro-phosphosilicate glass (BPSG)), and lower and upper portions of the insulating mold layer 140 may be formed to have different doping concentrations from each other.

In example embodiment, insulating mold layer 140 may be formed to have a thickness of about 500 Å to about 2000 Å. The insulating mold layer 140 may be formed using a deposition process with a good step coverage property. For example, the insulating mold layer 140 may be formed using a chemical vapor deposition process.

The insulating mold layer 140 may be patterned to form openings 141 exposing the contact plugs 135. For example, the formation of the openings 141 may include forming mask patterns (not shown) on the insulating mold layer 140, and anisotropically etching the insulating mold layer 140 using the mask patterns as an etch mask to expose the contact plugs 135, as described with reference to FIG. 2A. The openings 141 may be formed to have a hole shape.

As a result of the anisotropic etching process, each of the openings 141 may be formed to have a bottom width $W_B$ smaller than a top width $W_T$. For example, the top width $W_T$ of the openings 141 may range from about 10 nm to about 60 nm, and the bottom width $W_B$ of the openings 141 may range from about 10 nm to about 50 nm. The top width $W_T$ of the openings 141 may be substantially equivalent to or smaller than a space between the openings 141. For example, the top width $W_T$ of the openings 141 may range from about 10 nm to about 60 nm, and the space between the openings 141 may range from about 10 nm to about 100 nm.

The width of each opening 141 may decrease gradually from its top end. In other words, each of the openings 141 may have an inclined sidewall. In example embodiments, the sidewall of the opening 141 and the top surface of the semiconductor substrate 10 may form an acute angle of about 45-90 degrees or preferably, of about 60-80 degrees.

Referring to FIG. 12, as described with reference to FIG. 2A, after the formation of the openings 141, the insulating spacer 143 may be formed on inner walls of the openings 141. The insulating spacer 143 may be formed of an insulating material having an etch selectivity with respect to the insulating mold layer 140. The insulating spacer 143 may help substantially prevent a short circuit from occurring between the lower electrodes 150, which may be formed in a subsequent step.

Figure 13:
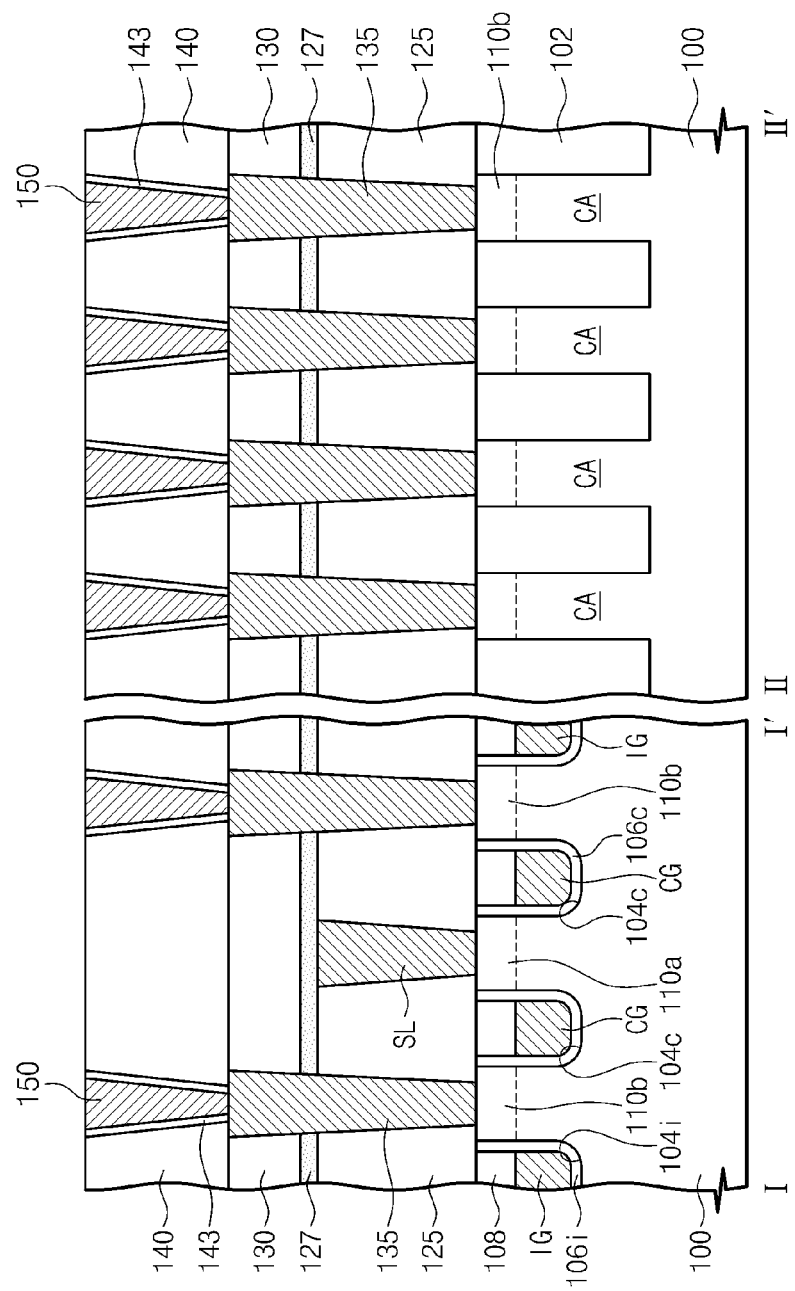

Referring to FIG. 13, the lower electrodes 150 may be formed in the openings 141 provided with the insulating spacer 143.

As described with reference to FIG. 2B, the lower electrodes 150 may be formed by depositing a conductive layer on the insulating mold layer 140 to fill the openings 141 and performing a planarization process to the conductive layer. The lower electrodes 150 may be connected to the contact plugs 135, respectively.

In the opening 141, a top width of the lower electrode 150 may be greater than a bottom width thereof. Further, the lower electrode 150 may be formed to have an increasing width from its bottom end. In other words, the lower electrodes 150 may have a sidewall arranged at an angle with respect to the top surface of the second interlayer insulating layer 130. In other embodiments, the sidewall of the lower electrode 150 may be rounded and inclined, as shown in FIG. 9.

For example, the sidewall of the lower electrode 150 and the top surface of the second interlayer insulating layer 130 may form an acute angle. In example embodiments, the less the angle is, the more easily and effectively a subsequent process of separating the data storage layers DS from each other is performed. For example, the angle between the sidewall of the lower electrode 150 and the top surface of the second interlayer insulating layer 130 may range from about 45 to about 90 degrees or from about 60 to about 80 degrees.

Figure 14:
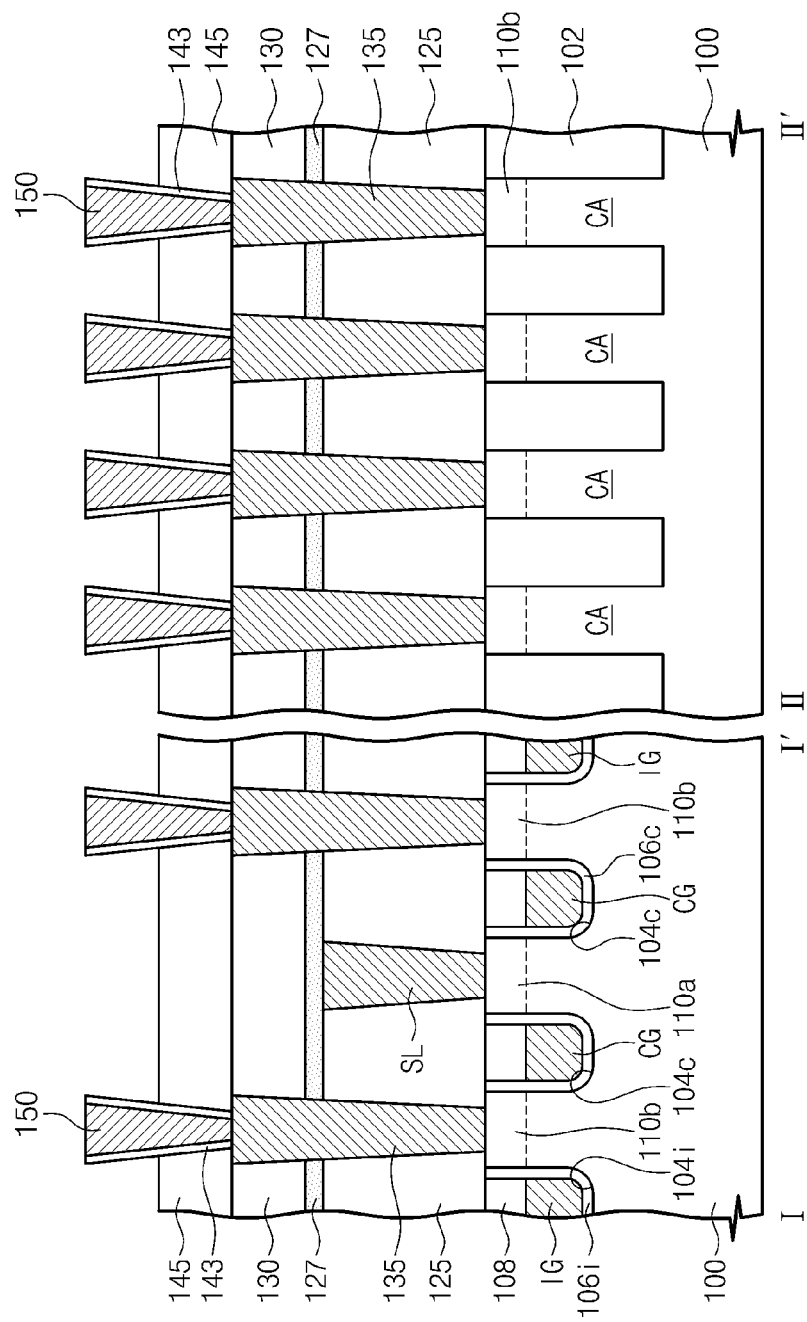

Referring to FIG. 14, as described with reference to FIG. 2C, the top surface of the insulating mold layer 140 may be vertically recessed to form the insulating mold pattern 145 surrounding lower portions of the lower electrodes 150. For example, upper portions of the lower electrodes 150 may protrude upward from the top surface of the insulating mold pattern 145. Here, the sidewalls of the lower electrodes 150 may be protected by the insulating spacer 143. In other words, a portion of the insulating spacer 143 may be exposed after recessing the top surface of the insulating mold layer 140.

In example embodiments, the portion of the lower electrode 150 protruding from the top surface of the insulating mold pattern 145 may have a height greater than half the total height of the lower electrode 150. The protruding height of the lower electrode 150 may be determined by a recess depth of the insulating mold layer 140. According to example embodiments of the inventive concept, it is desirable that a ratio of the top width $D_T$ of the lower electrode 150 to the protruding height H be high. In example embodiments, the ratio of $D_T$ to H may range from about 1:2 to about 1:5.

Furthermore, the sidewall of the protruding portion of the lower electrode 150 and the top surface of the insulating mold pattern 145 may form an acute angle. For example, the angle therebetween may range from about 45 degrees to about 90 degrees, and preferably, range from about 60 degrees to about 80 degrees.

Figure 15:
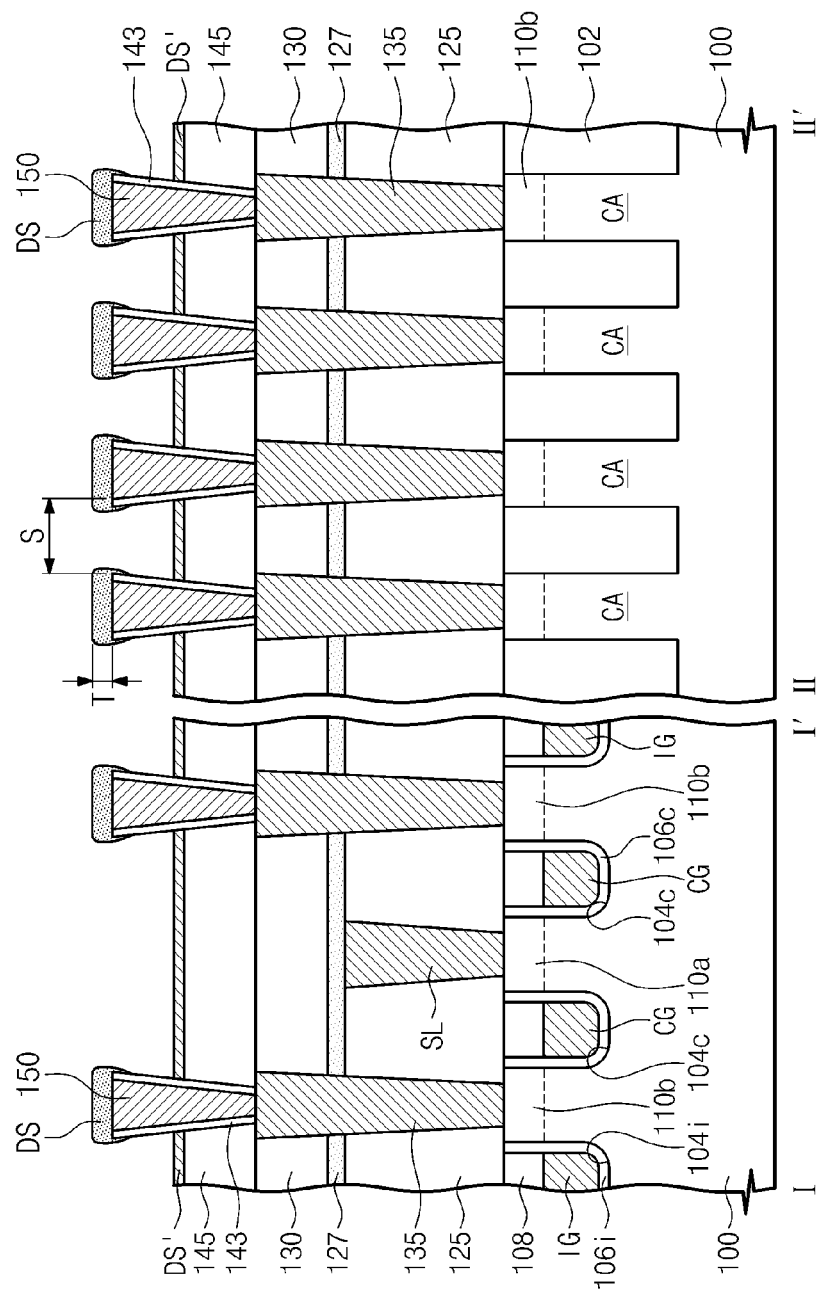

Referring to FIG. 15, the data storage layers DS may be formed to be separated from each other. In example embodiments, the formation of the data storage layers DS may be performed using a deposition technique, without the use of a patterning process. The data storage layers DS may be formed on the lower electrodes 150, respectively.

In example embodiments, the formation of the data storage layers DS may include sequentially depositing a plurality of layers. As described with reference to FIG. 2D, the layers constituting the data storage layers DS may be formed using a deposition process with a poor step coverage property. For example, the data storage layers DS may be formed using a physical vapor deposition (PVD) process.

As the result of the deposition process with poor step coverage property, the data storage layers DS may be discontinuously deposited on the protruding portions of the lower electrodes 150 and the top surface of the insulating mold pattern 145. Due to such a discontinuous deposition, the data storage layers DS can be formed spaced apart from each other, on the lower electrodes 150, without a patterning process.

According to example embodiments of the inventive concept, since the width of each lower electrode 150 decreases with increasing distance from its top end, a deposition rate of the deposited layer may be decreased at the sidewalls of the lower electrodes 150. In example embodiments, by using the physical vapor deposition, the data storage layer DS may be formed to have a step coverage of about 10% or less. In this case, the data storage layers DS may be locally deposited on the top surfaces of the lower electrodes 150, respectively, and be separated from each other.

In addition, each of the data storage layers DS may have a rounded edge. For example, edge portions of the data storage layers DS may be rounded by overhang phenomena that may occur in the PVD process.

Further, as described with reference to FIG. 2D, each of the data storage layers DS may extend from the top surfaces of the lower electrodes 150 around an upper portion of the sidewall of the insulating spacer 143. For example, each of the data storage layers DS may include a body portion covering the top surface of the lower electrode 150 and an edge portion extending from the body portion and covering the upper portion of the sidewall of the insulating spacer 143. The edge portion of the data storage layer DS may have a decreasing thickness toward the bottom of the lower electrode 150.

In addition, a deposition thickness t of the data storage layer DS on the top surfaces of the lower electrodes 150 may be smaller than a minimum space S between the lower electrodes 150 provided adjacent to each other. For example, the deposition thickness t of the data storage layer DS on the top surfaces of the lower electrodes 150 may range from about 50 Å to 500 Å, and the minimum space S between the lower electrodes 150 provided adjacent to each other may range from about 100 Å to 1000 Å.

Furthermore, during the deposition process for forming the data storage layers DS, a layer, which is made of the same material as the data storage layers DS, may be deposited on the top surface of the insulating mold pattern 35 exposed between the lower electrodes 40. For example, the remaining data storage layer DS' may be formed on the top surface of the insulating mold pattern 35. Here, during the deposition process with poor step coverage property, the metallic layer may not deposited on the inclined sidewalls of the lower electrodes 150, and thus, the remaining data storage layer DS' may be electrically separated from the data storage layers DS.

In example embodiment, as shown in FIG. 6, the formation of the data storage layers DS may include sequentially stacking the reference magnetic layer RL, the tunnel barrier layer TB, the free magnetic layer FL, and the capping electrode layer CE. The reference layer RL, the tunnel barrier layer TB, the free layer FL, and the capping electrode layer CE may be formed using the deposition process with poor step coverage property, as described above.

As a result, although the deposition processes are sequentially or successively performed, the reference magnetic layer RL, the tunnel barrier layer TB, the free magnetic layer FL, and the capping electrode layer CE can be locally deposited on the lower electrodes 150. In other words, there is no necessity to perform an additional patterning process including a photo lithography process and an etching process on the data storage layer DS with the magnetic material. This makes it possible to reduce technical difficulties, which may occur when a patterning process is performed to the data storage layer DS, and to reduce a fabrication cost of the semiconductor memory device.

In example embodiments, on the top surface of the lower electrode 150, a total thickness t of the reference magnetic layer RL, the tunnel barrier layer TB, the free magnetic layer FL, and the capping electrode layer CE may be smaller than the minimum space S between the lower electrodes 40 adjacent to each other, as shown in FIG. 15.

In other embodiments, the formation of the data storage layers DS may include sequentially depositing the first reference layer RL1, the first tunnel barrier layer TB1, the free layer FL, the second tunnel barrier layer TB2, and the second reference layer RL2, as shown in FIG. 7C. Here, the first reference layer RL1, the first tunnel barrier layer TB1, the free layer FL, the second tunnel barrier layer TB2, and the second reference layer RL2 may be formed using the deposition process with poor step coverage property, as described above. Further, as described above, the total thickness t of the first reference layer RL1, the first tunnel barrier layer TB1, the free layer FL, the second tunnel barrier layer TB2, and the second reference layer RL2 constituting the data storage layer DS may be smaller than the minimum space S between the lower electrodes 40 adjacent to each other.

Figure 16:
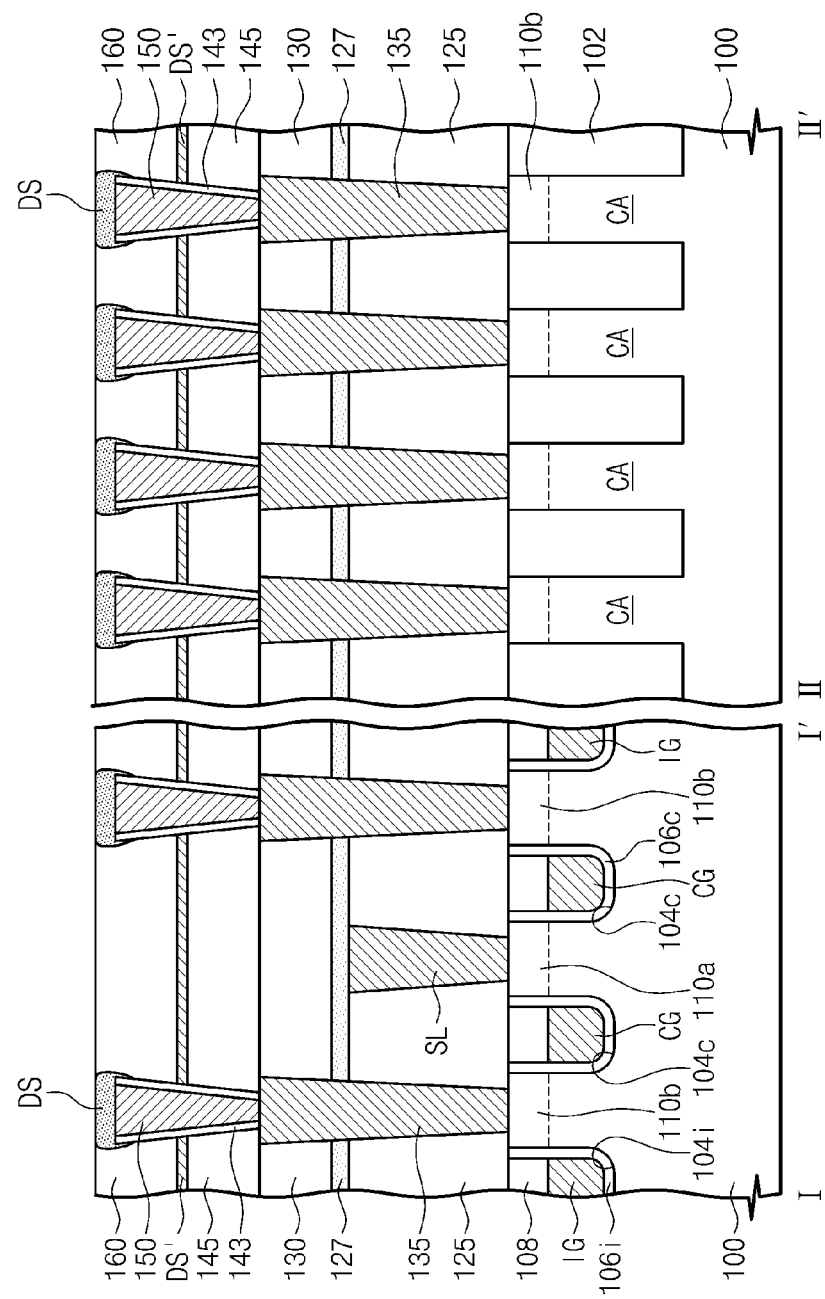

Referring to FIG. 16, the insulating gap-fill layer 160 may be formed to fill spaces between the data storage layers DS and between the lower electrodes 150. The insulating gap-fill layer 160 may be formed on the insulating mold pattern 145 provided with the remaining data storage layer DS'.

As described with reference to FIG. 2E, the formation of the insulating gap-fill layer 160 may include depositing an insulating layer to fill a space between the lower electrodes 150 and the data storage layers DS, and planarizing the insulating layer to expose the top surfaces of the data storage layers DS.

In example embodiment, as the result of the planarization process, the insulating gap-fill layer 160 may be formed to have the top surface substantially coplanar with those of the data storage layers DS. The insulating gap-fill layer 160 may be in direct contact with sidewalls of the data storage layers DS. For example, as described with reference to FIG. 6, the insulating gap-fill layer 160 may be in direct contact with the magnetic layers constituting each of the data storage layers DS. The insulating gap-fill layer 160 may be in direct contact with the insulating spacer 143. In still other embodiments, the insulating gap-fill layer 160 may be formed to fill the space between the data storage layers DS and between the lower electrodes 150 and to cover the top surfaces of the data storage layers DS.

Referring to FIG. 5, the third interlayer insulating layer 165 may be formed on the insulating gap-fill layer 160. A planarization process may be performed to make a top surface of the third interlayer insulating layer 165 substantially flat.

The third interlayer insulating layer 165 may be patterned to form grooves exposing the data storage layer DS. The grooves may extend along the first direction or parallel to the active line patterns ALP and to expose a plurality of the data storage layers DS arranged along the first direction.

Thereafter, a conductive wiring layer may be formed to fill the grooves, and a planarization process may be performed to the conductive wiring layer to expose the third interlayer insulating layer 165 and form the bit lines BL.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique.

Figure 17:
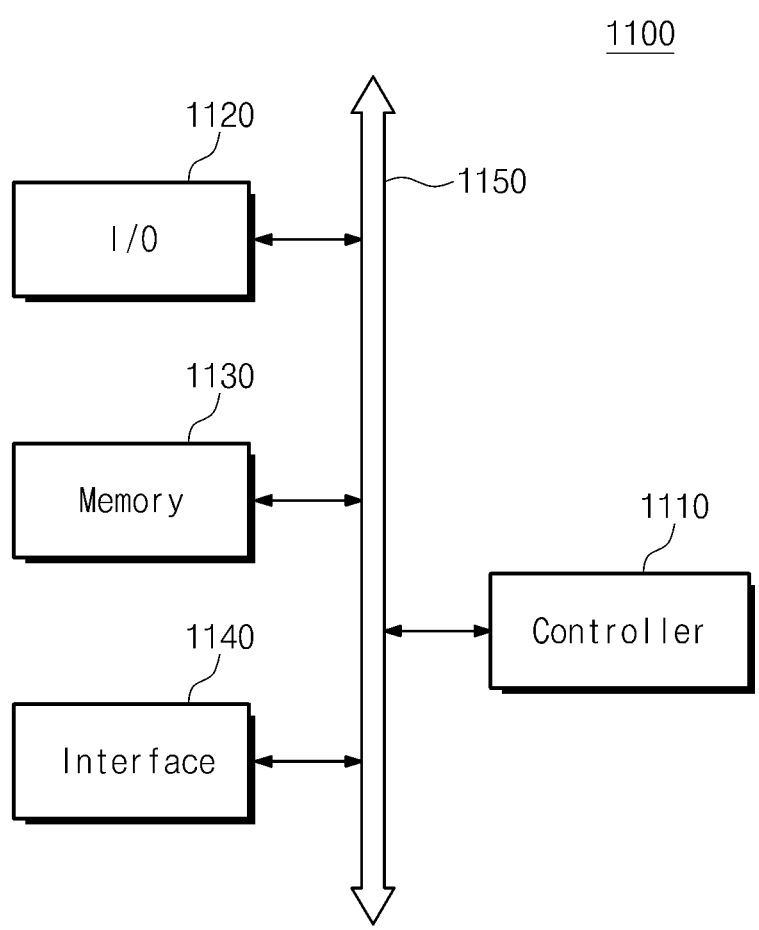
FIG. 17 is a schematic block diagram illustrating an example of electronic systems including a semiconductor memory device according to example embodiments of the inventive concept.

FIG. 17 is a schematic block diagram illustrating an example of electronic systems including a semiconductor memory device according to example embodiments of the inventive concept.

Referring to FIG. 17, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The controller 1110, the input-output unit 1120, the memory device 1130, and/or the interface 1140 may be configured to include one of semiconductor devices according to example embodiments of the inventive concept.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data wirelessly.

Figure 18:
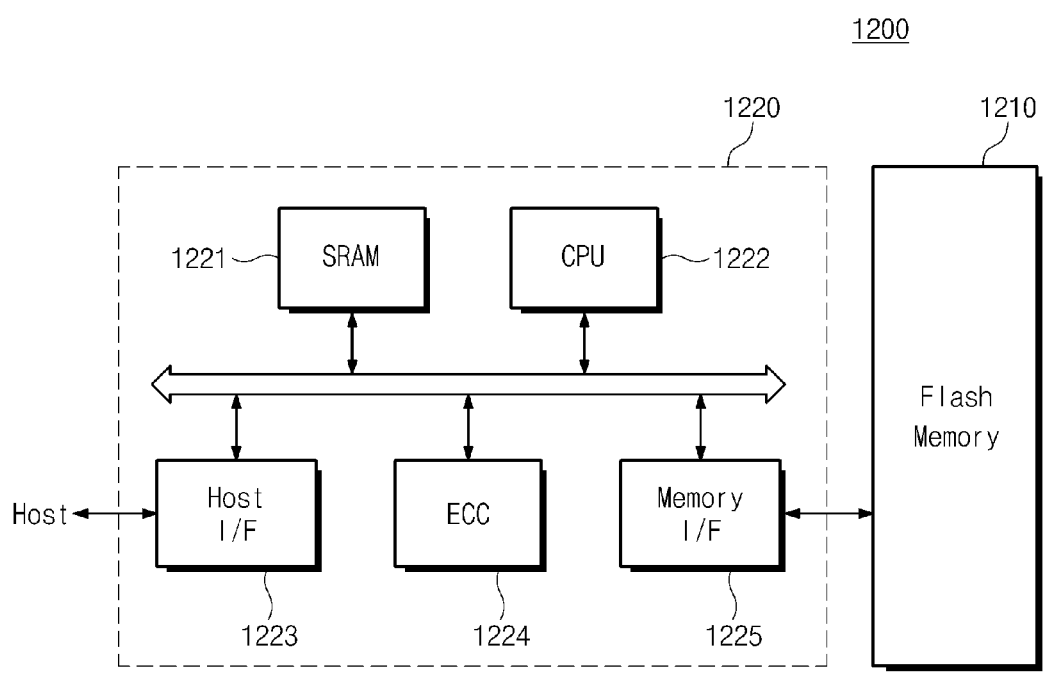
FIG. 18 is a schematic block diagram illustrating an example of memory cards including the semiconductor memory devices according to the embodiments of the inventive concept.

FIG. 18 is a schematic block diagram illustrating an example of memory cards including the semiconductor memory devices according to the embodiments of the inventive concept.

Referring to FIG. 18, a memory card 1200 according to example embodiments of the inventive concept may include a memory device 1210. The memory device 1210 may include at least one of the semiconductor memory devices according to the afore-described embodiments of the inventive concept. In other embodiments, the memory device 1210 may further include a semiconductor memory device, which is of a different type from the semiconductor memory devices according to the afore-described embodiments of the inventive concept. For example, the memory device 1210 may further include a nonvolatile memory device and/or a static random access memory (SRAM) device. The memory card 1200 may include a memory controller 1220 that controls data communication between a host and the memory device 1210. The memory device 1210 and/or the memory controller 1220 may be configured to include at least one of the semiconductor devices according to example embodiments of the inventive concept.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data, which are read out from the memory device 1210. The memory card 1200 may further include a read only memory (ROM) device that stores code data to interface with the host. The memory card 1200 may be used as a portable data storage card. Alternatively, the memory card 1200 may be provided in the form of solid state disks (SSD), instead of hard disks of computer systems.

Figure 19:
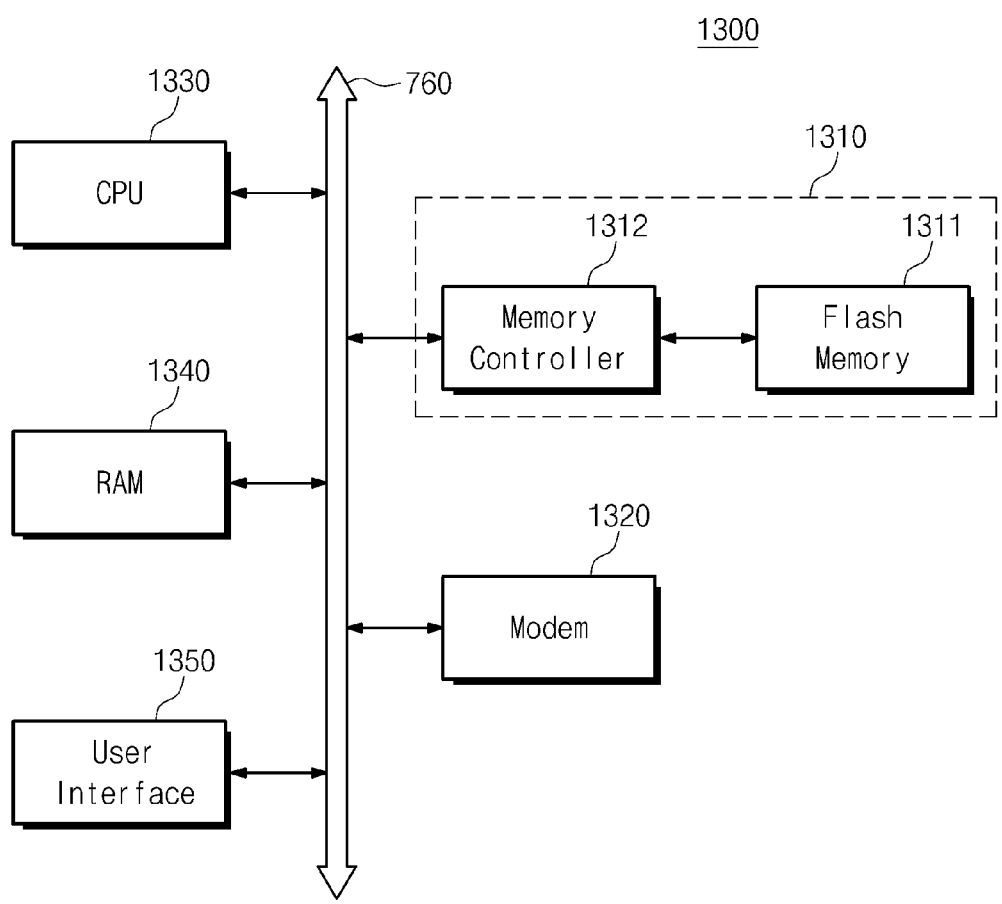
FIG. 19 is a schematic block diagram illustrating an example of information processing systems including a semiconductor memory device according to example embodiments of the inventive concept.

FIG. 19 is a schematic block diagram illustrating an example of information processing systems including a semiconductor memory device according to example embodiments of the inventive concept.

Referring to FIG. 19, an information processing system 1300 includes a memory system 1310, which may include at least one of the semiconductor memory devices according to example embodiments of the inventive concept. The information processing system 1300 also includes a modem 1320, a central processing unit (CPU) 1330, a RAM 1340, and a user interface 1350, which may be electrically connected to the memory system 1310 via a system bus 1360. The memory system 1310 may include a memory device 1311 and a memory controller 1312 controlling an overall operation of the memory device 1311. Data processed by the CPU 1330 and/or input from the outside may be stored in the memory system 1310. Here, the memory system 1310 may constitute a solid state drive SSD, and thus, the information processing system 1300 may be able to store reliably a large amount of data in the memory system 1310. This increase in reliability enables the memory system 1310 to conserve resources for error correction and realize a high speed data exchange function. Although not shown in the drawing, it will be apparent to those of ordinary skill in the art that the information processing system 1300 may be also configured to include an application chipset, a camera image processor (CIS), and/or an input/output device.

According to example embodiments of the inventive concept, a deposition process with a poor step coverage property may be used to form conductive patterns separated from each other, without a patterning process. This makes it possible to prevent technical problems, such as, metallic by-products or etch damage, which may occur when highly etch-resistant materials (e.g., metallic, ferromagnetic, or antiferromagnetic materials) are etched.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a memory element comprising:
an electrode having a top portion and a bottom portion;
a data storage pattern comprising a first magnetic layer, a second magnetic layer and a tunnel barrier layer disposed between the first magnetic layer and the second magnetic layer, the first magnetic layer being in direct contact with and entirely covering the top portion of the electrode and partially covering a side portion of the electrode;
an insulating mold pattern surrounding a lower portion of the electrode,
wherein a height difference between the top portion of the electrode and a top surface of the insulating mold pattern is greater than a top width of the electrode; and
a remaining data storage pattern provided on the top surface of the insulating mold pattern,
wherein the remaining data storage pattern is formed of a same material as a material that forms the data storage pattern and is electrically isolated from the data storage pattern, and
wherein one of the first and second magnetic layers comprises a magnetic fixed layer and the other comprises a magnetic free layer.

2. The semiconductor device of claim 1,
wherein the data storage pattern comprises a rounded edge near an upper corner of the electrode.

3. The semiconductor device of claim 1,
wherein the electrode comprises a top width greater than a bottom width thereof.

4. The semiconductor device of claim 1, further comprising an insulating layer between the data storage pattern and the side portion of the electrode and extending to the bottom portion of the electrode.

5. The semiconductor device of claim 4,
wherein the data storage pattern comprises:
a body portion covering the top portion of the electrode; and
an edge portion extending from the body portion and partially covering a sidewall of the insulating layer.

6. The semiconductor device of claim 5,
wherein a thickness of the edge portion of the data storage pattern decreases from the top portion of the electrode toward the bottom portion thereof.

7. The semiconductor device of claim 1,
wherein the side portion of the electrode is curved.

8. The semiconductor device of claim 1,
wherein a lowest point of the data storage pattern is located at a level lower than an uppermost surface of the electrode.

9. The semiconductor device of claim 1, wherein a ratio of the top width of the electrode to the height difference between the top portion of the electrode and the top surface of the insulating mold pattern ranges from about 1:2 to about 1:5.

10. The semiconductor device of claim 1, wherein the top surface of the insulating mold pattern and the side portion of the electrode form an angle of about 45 to about 90 degrees.

11. The semiconductor device of claim 1, further comprising a remaining data storage pattern provided on the top surface of the insulating mold pattern,
wherein the remaining data storage pattern is formed of a same material as a material that forms the data storage pattern and is separated from the data storage pattern.

12. The semiconductor device of claim 1,
wherein the memory element is provided with a plurality of memory elements,
wherein a thickness of the data storage pattern, measured from the top portion of the electrode, is smaller than a minimum space between electrodes disposed adjacent to each other.

13. The semiconductor device of claim 1,
wherein the data storage pattern further comprises a capping electrode layer on the second magnetic layer.

14. A semiconductor device, comprising:
a memory element comprising:
an electrode having a top portion and a bottom portion;
an insulating layer covering a side portion of the electrode and extending from the top portion of the electrode to the bottom portion of the electrode; and
a data storage pattern covering the top portion of the electrode and an upper portion of the insulating layer,
wherein the data storage pattern comprises magnetic fixed layer, tunnel barrier, and magnetic free layer,
wherein the data storage pattern further comprises a body portion covering the top portion of the electrode and an edge portion extending along the electrode from the body portion toward the bottom portion of the electrode, an entire length of the edge portion extending along the electrode and ending between the top portion of the electrode and the bottom portion of the electrode, the edge portion covering the upper portion of the insulating layer and being spaced apart from the side portion of the electrode by the upper portion of the insulating layer interposed therebetween, and
wherein a thickness of the edge portion of the data storage pattern decreases from the top portion of the electrode toward the bottom portion of the electrode without increasing between the top portion of the electrode and the end of the edge portion.

15. The semiconductor device of claim 14,
wherein the side portion of the electrode vertically extends over a top surface of a substrate.

16. The semiconductor device of claim 15,
wherein the edge portion is spaced apart from the side portion of the electrode with the upper portion of the insulating layer interposed therebetween.

17. A semiconductor device, comprising:
a memory element including an electrode having a top portion and a bottom portion, and a data storage pattern,
wherein the data storage pattern comprises magnetic fixed layer, tunnel barrier, and magnetic free layer,
wherein a body portion of the data storage pattern covers the top portion of the electrode,
wherein an edge portion of the data storage pattern extends from the body portion of the data storage pattern toward the bottom portion of the electrode, an entire length of the edge portion extending along the electrode and ending between the top portion of the electrode and the bottom portion of the electrode,
wherein the edge portion of the data storage pattern is spaced apart from the electrode, and
wherein a thickness of the edge portion of the data storage pattern decreases from the top portion of the electrode toward the bottom portion thereof without increasing between the top portion of the electrode and the end of the edge portion.

* * * * *